US012684963B2

(12) United States Patent
Kim et al.

(10) Patent No.: US 12,684,963 B2
(45) Date of Patent: Jul. 14, 2026

(54) DISPLAY DEVICE

(71) Applicant: Samsung Display Co., Ltd., Yongin-Si (KR)

(72) Inventors: Haemin Kim, Yongin-si (KR);
Kyunghoon Chung, Yongin-si (KR);
Myunghoon Park, Yongin-si (KR);
Byungchang Yu, Yongin-si (KR);
Dong-Hoon Lee, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 637 days.

(21) Appl. No.: 17/953,366

(22) Filed: Sep. 27, 2022

(65) Prior Publication Data

US 2023/0329046 A1 Oct. 12, 2023

(30) Foreign Application Priority Data

Apr. 6, 2022 (KR) ........................ 10-2022-0042870

(51) Int. Cl.
*H10K 59/126* (2023.01)
*H10K 59/124* (2023.01)
*H10K 59/131* (2023.01)

(52) U.S. Cl.
CPC ......... *H10K 59/126* (2023.02); *H10K 59/124* (2023.02); *H10K 59/131* (2023.02)

(58) Field of Classification Search
CPC .... H10K 59/12; H10K 59/121; H10K 59/126; H10K 59/124; H10K 59/131; H10K 59/123; H10K 59/179; H10K 59/805; H10K 59/80515; H10K 59/8052; H10K 59/80521; H10K 59/82; H10K 59/8791;
H10K 59/8792; H10K 59/88; H10K 50/895; H10K 50/81; H10K 50/813; H10K 50/82; H10K 50/822; H10K 50/86; H10K 50/865; H10D 86/423; H10D 86/441; H10D 86/481;
(Continued)

(56) References Cited

U.S. PATENT DOCUMENTS 9,439,315 B2 9/2016 Lee et al.
9,759,940 B2 9/2017 Shin et al.
(Continued)

FOREIGN PATENT DOCUMENTS

CN 112864174 A * 5/2021 ............. B82Y 40/00
KR 10-1524449 B1 6/2015
(Continued)

OTHER PUBLICATIONS

Dae et al., Organic Light Emitting Diode Display Having Static Electricity Shielding Structure, 2016, machine translation of KR-2016070257-A, pp. 1-8. (Year: 2016).*
(Continued)

*Primary Examiner* — Natalia A Gondarenko
(74) *Attorney, Agent, or Firm* — Innovation Counsel LLP

(57) ABSTRACT

A display device includes a data line, a first power line, a second power line, a pixel disposed in a display area and connected to the data line, the first power line, and the second power line, a transistor disposed in a non-display area around the display area and connected to the data line and the first power line, and a first light shielding layer extending from a portion of the second power line to the transistor and disposed on the transistor.

19 Claims, 18 Drawing Sheets

(58) Field of Classification Search
CPC .... H10D 86/60; H10H 29/49; H10H 29/8508;
G02F 1/1339; G02F 1/136204; G02F
1/136286; G02F 1/13629; G02F
1/133331; G02F 1/133334; G02F
1/133514; G02F 1/1336
USPC ...................................................... 257/40, 72
See application file for complete search history.

(56)                       References Cited

U.S. PATENT DOCUMENTS

| | | | | |
|---|---|---|---|---|
| 2014/0145181 A1* | 5/2014 | Yamazaki | ............ | H10D 89/931 |
| | | | | 257/773 |
| 2019/0237533 A1* | 8/2019 | Kim | .................... | H10K 59/131 |
| 2020/0144345 A1* | 5/2020 | Cha | .................... | H10K 59/124 |
| 2020/0343326 A1* | 10/2020 | Park | .................... | H10D 89/931 |

FOREIGN PATENT DOCUMENTS

| | | | | |
|---|---|---|---|---|
| KR | 10-2016-0070257 A | 6/2016 | | |
| KR | 10-2017-0079854 A | 7/2019 | | |
| KR | 20200076096 A | * 6/2020 | .............. | G09G 3/20 |
| KR | 10-2147842 B1 | 8/2020 | | |

OTHER PUBLICATIONS

Liu et al., A TFT Array Substrate and Preparation Method and Display Device Thereof, 2021, machine translation of CN 112864174 , pp. 1-12. (Year: 2021).*
Park, Display Device, 2020, machine translation of KR 20200076096 A, pp. 1-8. (Year: 2020).*

\* cited by examiner

FIG. 7

BML

SHL2(DGT)

PRT1

DISPLAY DEVICE

This U.S. non-provisional patent application claims priority under 35 U.S.C. § 119 to Korean Patent Application No. 10-2022-0042870, filed on Apr. 6, 2022, the contents of which are hereby incorporated by reference in its entirety.

BACKGROUND

1. Field of Disclosure

The present disclosure relates to a display device.

2. Description of the Related Art

Electronic devices that provide images to a user, such as a smart phone, a digital camera, a notebook computer, a navigation unit, and a smart television, include a display device to display the images. The display device generates the images and provides the images to the user through a display screen thereof.

The display device includes a display panel including pixels generating the images and a driver driving the pixels. The pixels are connected to data lines receiving data voltages, scan lines receiving scan signals, and emission lines receiving emission signals. The pixels receive the data voltages in response to the scan signals. The pixels emit lights with brightness corresponding to the data voltages in response to the emission signals to display the images.

The pixels are vulnerable to static electricity. When the static electricity is applied to the pixels via the data lines, the pixels are damaged. Accordingly, a structure to prevent the static electricity from being applied to the pixels is required.

SUMMARY

The present disclosure provides a display device capable of protecting an anti-static element from a light.

Embodiments of the inventive concept provide a display device including a data line, a first power line, a second power line, a pixel disposed in a display area and connected to the data line, the first power line, and the second power line, a transistor disposed in a non-display area around the display area and connected to the data line and the first power line, and a first light shielding layer extending from a portion of the second power line to the transistor and disposed on the transistor.

Embodiments of the inventive concept provide a display device including a data line, a first power line, a second power line, a pixel disposed in a display area and connected to the data line, the first power line, and the second power line, a transistor disposed in a non-display area around the display area and connected to the data line and the first power line, and a first light shielding layer extending from a portion of the second power line to the transistor and disposed on the transistor. The first light shield layer is provided with a plurality of grooves defined in one side thereof.

According to the above, as the first light shielding layer is disposed on a semiconductor layer of an anti-static element and a second light shielding layer is disposed under the semiconductor layer, the semiconductor layer is blocked from an external light. Accordingly, the anti-static element is protected from the external light, and characteristics of the anti-static element are not changed.

BRIEF DESCRIPTION OF THE DRAWINGS

The above and other advantages of the present disclosure will become readily apparent by reference to the following detailed description when considered in conjunction with the accompanying drawings wherein:

FIGS. 7, 8, 9, 10, 11, 12, 13 and 14 are plan views of a structure of anti-static elements shown in FIG. 6;

DETAILED DESCRIPTION

Figure 1:
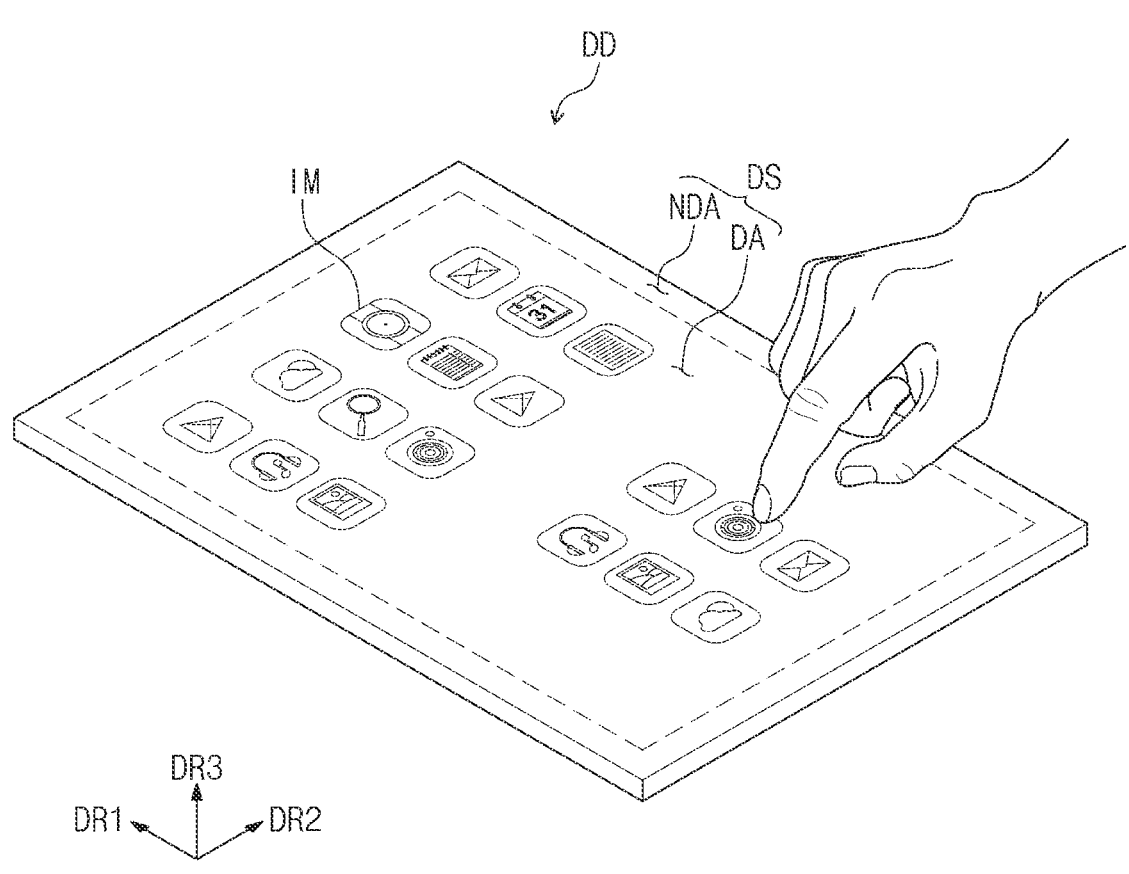
FIG. 1 is a perspective view of a display device according to an embodiment of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the present disclosure will be described with reference to accompanying drawings.

FIG. 1 is a perspective view of a display device DD according to an embodiment of the present disclosure.

Referring to FIG. 1, the display device DD may have a rectangular shape defined by long sides extending in a first direction DR1 and short sides extending in a second direction DR2 crossing the first direction DR1. However, the shape of the display device DD should not be limited to the rectangular shape, and the display device DD may have various shapes, such as a circular shape and a polygonal shape.

Hereinafter, a direction substantially perpendicular to a plane defined by the first direction DR1 and the second direction DR2 may be referred to as a third direction DR3. In the present disclosure, the expression "when viewed in a plane" or "in a plan view" may mean a state of being viewed in the third direction DR3.

An upper surface of the display device DD may be referred to as a display surface DS and may be a plane surface defined by the first direction DR1 and the second direction DR2. Images IM generated by the display device DD may be provided to a user through the display surface DS.

The display surface DS may include a display area DA and a non-display area NDA around the display area DA. The display area DA may display the images IM, and the non-display area NDA may not display the images IM. The non-display area NDA may surround the display area DA and may define an edge of the display device DD which is printed with a predetermined color.

The display device DD may be applied to a large-sized electronic device, such as a television set, a monitor, or an outdoor billboard, and a small and medium-sized electronic device, such as a personal computer, a notebook computer, a personal digital assistant, a car navigation unit, a game unit, a smartphone, a tablet computer, and a camera. However, these are merely examples, and the display device DD may be applied to other electronic devices as long as they do not depart from the concept of the present disclosure.

Figure 2:
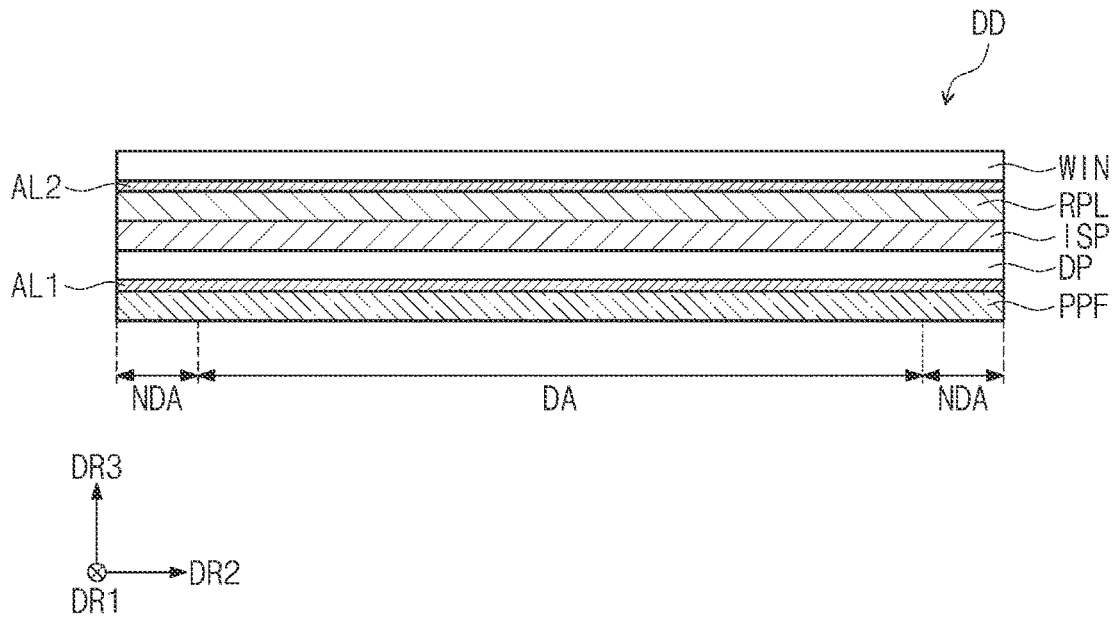
FIG. 2 is a cross-sectional view of the display device shown in FIG. 1.

FIG. 2 is a cross-sectional view showing the display device DD shown in FIG. 1.

As an example, FIG. 2 shows a cross-section of the display device DD when viewed in the first direction DR1.

Referring to FIG. 2, the display device DD may include a display panel DP, an input sensing unit ISP, an anti-reflective layer RPL, a window WIN, a panel protective film PPF, and first and second adhesive layers AL1 and AL2.

The display panel DP may be a flexible display panel. The display panel DP may be a light-emitting type display panel, however, it should not be particularly limited. For instance, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot or a quantum rod. Hereinafter, the organic light emitting display panel will be described as a representative example of the display panel DP.

The input sensing unit ISP may be disposed on the display panel DP. The input sensing unit ISP may include a plurality of sensing portions (not shown) to sense an external input by a capacitive method. The input sensing unit ISP may be manufactured directly on the display panel DP when the display device DD is manufactured, however, it should not be limited thereto or thereby. According to an embodiment, the input sensing unit ISP may be attached to the display panel DP by an adhesive layer after being manufactured separately from the display panel DP.

The anti-reflective layer RPL may be disposed on the input sensing unit ISP. The anti-reflective layer RPL may be manufactured directly on the input sensing unit ISP when the display device DD is manufactured, however, the present disclosure should not be limited thereto or thereby. According to an embodiment, the anti-reflective layer RPL may be attached to the input sensing unit ISP by an adhesive layer after being manufactured as a separate panel.

The anti-reflective layer RPL may be an external light reflection preventing film. The anti-reflective layer RPL may reduce a reflectance with respect to an external light incident to the display panel DP from the above of the display device DD. The external light may not be perceived by the user by the anti-reflective layer RPL.

The window WIN may be disposed on the anti-reflective layer RPL. The window WIN may protect the display panel DP, the input sensing unit ISP, and the anti-reflective layer RPL from external scratches and impacts.

The panel protective film PPF may be disposed under the display panel DP. The panel protective film PPF may protect a lower portion of the display panel DP. The panel protective film PPF may include a flexible plastic material such as polyethylene terephthalate (PET).

The first adhesive layer AL1 may be disposed between the display panel DP and the panel protective film PPF. The display panel DP and the panel protective film PPF may be coupled to each other by the first adhesive layer AL1. The second adhesive layer AL2 may be disposed between the window WIN and the anti-reflective layer RPL, and the window WIN and the anti-reflective layer RPL may be coupled to each other by the second adhesive layer AL2.

Figure 3:
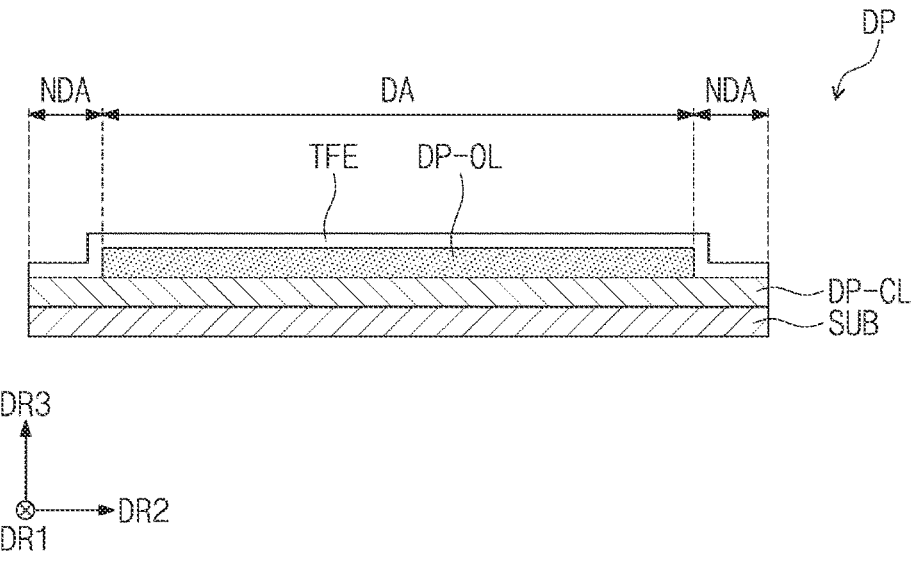
FIG. 3 is a cross-sectional view of a display panel shown in FIG. 2.

FIG. 3 is a cross-sectional view showing the display panel DP shown in FIG. 2.

As an example, FIG. 3 shows a cross-section of the display panel DP when viewed in the first direction DR1.

Referring to FIG. 3, the display panel DP may include a substrate SUB, a circuit element layer DP-CL disposed on the substrate SUB, a display element layer DP-OL disposed on the circuit element layer DP-CL, and a thin film encapsulation layer TFE disposed on the display element layer DP-OL.

The substrate SUB may include the display area DA and the non-display area NDA around the display area DA. The substrate SUB may include a glass material or a flexible plastic material such as polyimide (PI). The display element layer DP-OL may be disposed in the display area DA.

A plurality of pixels may be disposed in the circuit element layer DP-CL and the display element layer DP-OL. Each pixel may include a transistor disposed in the circuit element layer DP-CL and a light emitting element disposed in the display element layer DP-OL and connected to the transistor. The pixel will be described in detail later.

The thin film encapsulation layer TFE may be disposed on the circuit element layer DP-CL to cover the display element layer DP-OL. The thin film encapsulation layer TFE may protect the pixels from moisture, oxygen, and a foreign substance.

Figure 4:
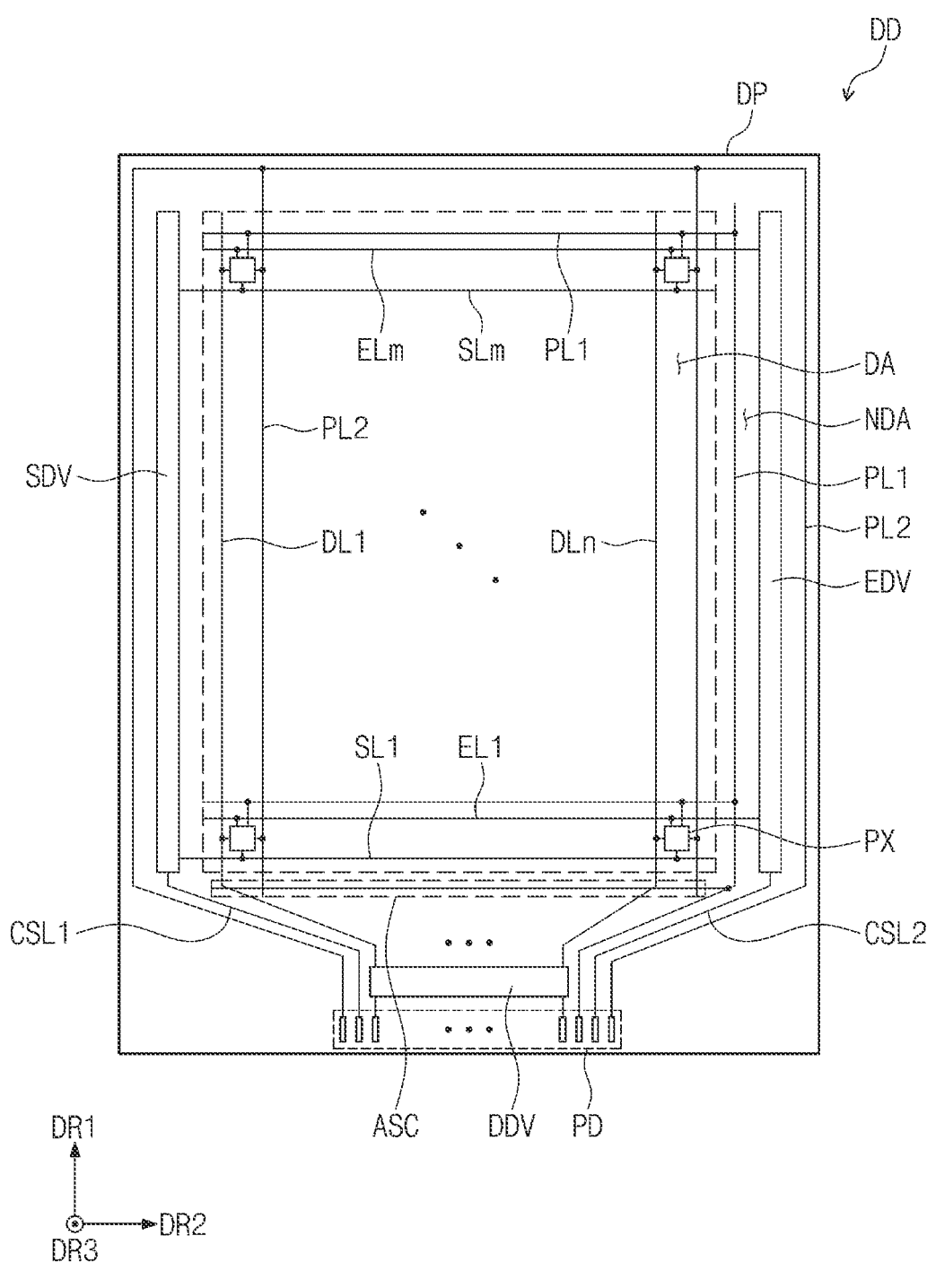
FIG. 4 is a plan view of the display panel shown in FIG. 2.

FIG. 4 is a plan view showing the display panel DP shown in FIG. 2.

Referring to FIG. 4, the display device DD may include the display panel DP, a scan driver SDV, a data driver DDV, a light emission driver EDV, a plurality of pads PD, and an anti-static circuit ASC.

The display panel DP may have a rectangular shape having long sides extending in the first direction DR1 and short sides extending in the second direction DR2, however, the shape of the display panel DP should not be limited thereto or thereby. The display panel DP may include the display area DA and the non-display area NDA surrounding the display area DA.

The display panel DP may include a plurality of pixels PX, a plurality of scan lines SL1 to SLm, a plurality of data lines DL1 to DLn, a plurality of emission lines EL1 to Elm, first and second control lines CSL1 and CSL2, and first and second power lines PL1 and PL2. Each of "m" and "n" is a natural number.

The pixels PX may be arranged in the display area DA. The scan driver SDV and the light emission driver EDV may be disposed in the non-display area NDA respectively adjacent to the long sides of the display panel DP. The data driver DDV may be disposed in the non-display area NDA to be adjacent to one short side of the short sides of the display panel DP. When viewed in a plane, the data driver DDV may be disposed to be adjacent to a lower end of the display panel DP.

The scan lines SL1 to SLm may extend in the second direction DR2 and may be connected to the pixels PX and the scan driver SDV. The data lines DL1 to DLn may extend in the first direction DR1 and may be connected to the pixels PX and the data driver DDV. The emission lines EL1 to ELm may extend in the second direction DR2 and may be connected to the pixels PX and the light emission driver EDV.

The first power line PL1 may extend in the first direction DR1 and may be disposed in the non-display area NDA. The first power line PL1 may be disposed between the display area DA and the light emission driver EDV. The first power line PL1 may extend toward the display area DA and may be connected to the pixels PX. A first voltage may be applied to the pixels PX via the first power line PL1.

The second power line PL2 may be disposed in the non-display area NDA. The second power line PL2 may extend along the long sides of the display panel DP and the other short side at which the data driver DDV is not disposed in the display panel DP. The second power line PL2 may be disposed outside the scan driver SDV and the light emission driver EDV. The second power line PL2 may extend toward the display area DA and may be connected to the pixels PX. A second voltage having a level lower than that of the first voltage may be applied to the pixels PX via the second power line PL2.

The first control line CSL1 may be connected to the scan driver SDV and may extend toward the lower end of the display panel DP. The second control line CSL2 may be connected to the light emission driver EDV and may extend toward the lower end of the display panel DP. The data driver DDV may be disposed between the first control line CSL1 and the second control line CSL2.

The pads PD may be disposed in the non-display area NDA adjacent to the lower end of the display panel DP. The pads PD may be disposed closer to the lower end of the display panel DP than the data driver DDV is. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

Although not shown in figures, the display device DD may further include a timing controller to control an operation of the scan driver SDV, the data driver DDV, and the light emission driver EDV and a voltage generator to generate the first and second voltages. The timing controller and the voltage generator may be connected to corresponding pads PD through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The light emission driver EDV may generate a plurality of emission signals, and the emission signals may be applied to the pixels PX through the emission lines EL1 to ELm.

The pixels PX may receive the data voltages in response to the scan signals. The pixels PX may emit a light having a luminance corresponding to the data voltages in response to the emission signals, and thus, the images may be displayed.

The anti-static circuit ASC may be disposed in the non-display area NDA between the data driver DDV and the display area DA. The anti-static circuit ASC may prevent the static electricity from being applied to the pixels PX through the data lines DL1 to DLn.

The anti-static circuit ASC may be connected to the data lines DL1 to DLn. The first power line PL1 may extend toward the anti-static circuit ASC and may be connected to the anti-static circuit ASC. The second power line PL2 may extend toward the anti-static circuit ASC and may protect elements of the anti-static circuit ASC from the light. This will be described in detail later.

Figure 5:
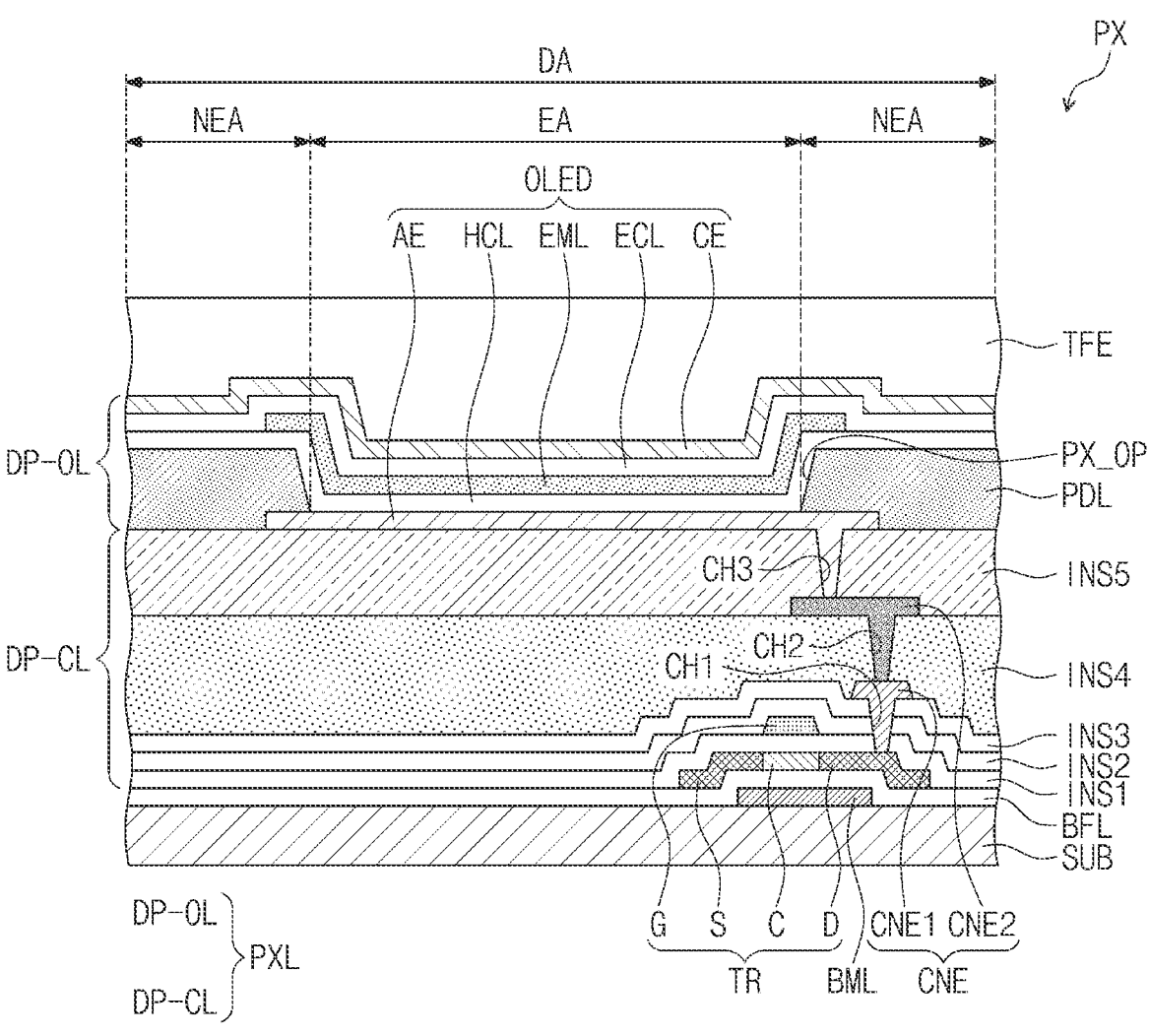
FIG. 5 is a cross-sectional view of a light emitting element shown in FIG. 4.

FIG. 5 is a cross-sectional view of a light emitting element shown in FIG. 4.

Referring to FIG. 5, the pixel PX may include the transistor TR and the light emitting element OLED. The light emitting element OLED may include a first electrode (or an anode) AE, a second electrode (or a cathode) CE, a hole control layer HCL, an electron control layer ECL, and a light emitting layer EML.

The transistor TR and the light emitting element OLED may be disposed on the substrate SUB. As an example, one transistor TR is shown in FIG. 5, however, the pixel PX may include a plurality of transistors and at least one capacitor to drive the light emitting element OLED.

The display area DA may include a light emitting area EA corresponding to each pixel PX and a non-light-emitting area NEA around the light emitting area EA. The light emitting element OLED may be disposed in the light emitting area EA.

A lower metal layer BML may be disposed on the substrate SUB, and a buffer layer BFL may be disposed on the lower metal layer BML. The buffer layer BFL may be an inorganic layer. The buffer layer BFL may be disposed on the substrate SUB to cover the lower metal layer BML. The lower metal layer BML will be described in detail with reference to FIG. 7.

The transistor TR may include a semiconductor layer (or an active) S, C, and D and a gate G. The semiconductor layer S, C, and D may include polycrystalline silicon, amorphous silicon, or metal oxide semiconductor.

The semiconductor layer may be doped with an N-type dopant or a P-type dopant. The semiconductor layer may include a high-doped region and a low-doped region. The high-doped region S and D may have a conductivity greater than that of the low-doped region and may constitute a source area S and a drain area D of the transistor TR. The low-doped region C may constitute a channel area C. The source area S, the channel area C, and the drain area D of the transistor TR may be formed from the semiconductor layer. The source area S and the drain area D may substantially serve as a source and a drain of the transistor TR.

A first insulating layer INS1 may be disposed on the semiconductor layer. The gate G of the transistor TR may be disposed on the first insulating layer INS1. When viewed in the plane, the gate G may overlap the channel area C.

A second insulating layer INS2 may be disposed on the gate G. A third insulating layer INS3 may be disposed on the second insulating layer INS2. The third insulating layer INS3 may be defined as an interlayer insulating layer.

A connection electrode CNE may include a first connection electrode CNE1 and a second connection electrode CNE2 to connect the transistor TR to the light emitting element OLED. The first connection electrode CNE1 may be disposed on the third insulating layer INS3 and may be connected to the drain area D via a first contact hole CH1 defined through the first, second, and third insulating layers INS1, INS2, and INS3.

A fourth insulating layer INS4 may be disposed on the first connection electrode CNE1. The fourth insulating layer INS4 may be disposed on the third insulating layer INS3 to cover the first connection electrode CNE1. The fourth insulating layer INS4 may be defined as a planarization insulating layer.

The second connection electrode CNE2 may be disposed on the fourth insulating layer INS4. The second connection electrode CNE2 may be connected to the first connection electrode CNE1 via a second contact hole CH2 defined through the fourth insulating layer INS4.

A fifth insulating layer INS5 may be disposed on the second connection electrode CNE2. Each layer from the buffer layer BFL to the fifth insulating layer INS5 may be defined as the circuit element layer DP-CL. Each of the first to third insulating layers INS1 to INS3 may be an inorganic layer. Each of the fourth and fifth insulating layers INS4 to INS5 may be an organic layer.

The first electrode AE may be disposed on the fifth insulating layer INS5. The first electrode AE may be connected to the second connection electrode CNE2 via a third contact hole CH3 defined through the fifth insulating layer INS5. A pixel definition layer PDL, which is provided with a pixel opening PX_OP define therethrough to expose a predetermined portion of the first electrode AE, may be disposed on the first electrode AE and the fifth insulating layer INS5.

The hole control layer HCL may be disposed on the first electrode AE and the pixel definition layer PDL. The hole control layer HCL may include a hole transport layer and a hole injection layer.

The light emitting layer EML may be disposed on the hole control layer HCL. The light emitting layer EML may be disposed in the pixel opening PX_OP. The light emitting layer EML may include an organic material and/or an inorganic material. The light emitting layer EML may generate a light having one of red, green, and blue colors.

The electron control layer ECL may be disposed on the light emitting layer EML and the hole control layer HCL. The electron control layer ECL may include an electron transport layer and an electron injection layer. The hole control layer HCL and the electron control layer ECL may be commonly disposed in the light emitting area EA and the non-light-emitting area NEA.

The second electrode CE may be disposed on the electron control layer ECL. The second electrode CE may be commonly disposed over the pixels PX. A layer on which the light emitting element OLED is disposed may be referred to as the display element layer DP-OL. The circuit element layer DP-CL and the display element layer DP-OL may be referred to as a pixel layer PXL.

The thin film encapsulation layer TFE may be disposed on the second electrode CE and may cover the pixel PX. Although not shown in figures, the thin film encapsulation layer TFE may include two inorganic layers and an organic layer disposed between the two inorganic layers. The inorganic layers may protect the pixel PX from moisture and oxygen. The organic layer may protect the pixel PX from a foreign substance such as dust particles.

The first voltage may be applied to the first electrode AE via the transistor TR, and the second voltage may be applied to the second electrode CE. Holes and electrons injected into the light emitting layer EML may be recombined to generate excitons, and the light emitting element OLED may emit the light by the excitons that return to a ground state from an excited state.

Figure 6:
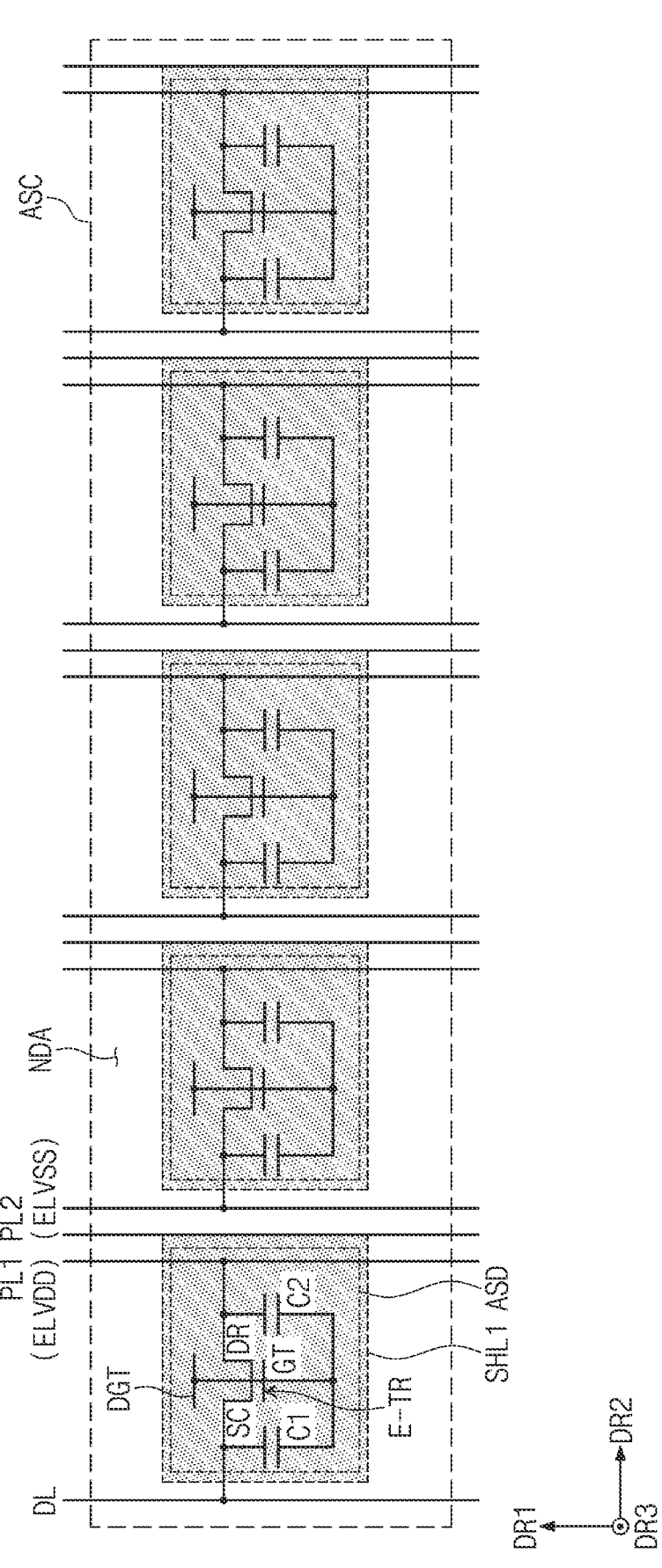
FIG. 6 is an equivalent circuit diagram of an anti-static circuit shown in FIG. 4.

FIG. 6 is an equivalent circuit diagram of the anti-static circuit ASC shown in FIG. 4.

Referring to FIG. 6, data lines DL and the first and second power lines PL1 and PL2 may extend in the first direction DR1 and may be arranged in the second direction DR2. The data lines DL may be a portion of the data lines DL1 to DLn. As an example, the data lines DL may be five data lines arranged from the leftmost side in the second direction DR2 among the data lines DL1 to DLn.

The first power lines PL1 may receive the first voltage ELVDD and the second power lines PL2 may receive the second voltage ELVSS having the level lower than that of the first voltage ELVDD.

The anti-static circuit ASC may include a plurality of anti-static elements ASD arranged in the second direction DR2. The anti-static elements ASD may be connected to the data lines DL and the first power lines PL1. Since the anti-static elements ASD have substantially the same structure, hereinafter, one anti-static element ASD connected to one data line DL will be described in detail.

The anti-static element ASD may include a transistor E-TR and first and second capacitors C1 and C2. The transistor E-TR may include a NMOS transistor. The transistor E-TR may include an oxide semiconductor.

The transistor E-TR may be connected to the data line DL and the first power line PL1. The second power line PL2 may be disposed adjacent to the first power line PL1. A first light shielding layer SHL1 extending from a portion of the second power line PL2 may be disposed to overlap the transistor E-TR. The first light shielding layer SHL1 may block a light from reaching the transistor E-TR from above of the transistor E-TR. This structure will be described in detail later with reference to cross-sectional views of the transistor E-TR.

The first capacitor C1 may be disposed between the transistor E-TR and the data line DL and may be connected to the transistor E-TR and the data line DL. The second capacitor C2 may be disposed between the transistor E-TR and the first power line PL1 and may be connected to the transistor E-TR and the first power line PL1.

The transistor E-TR may include a source area SC, a drain area DR, a gate GT, and a dummy gate DGT. The transistor E-TR may include the semiconductor layer (refer to FIG. 8), and the source area SC and the drain area DR may be formed from the semiconductor layer. The source area SC and the drain area DR may substantially serve as the source and the drain of the transistor E-TR.

The source area SC may be connected to the data line DL. The drain area DR may be connected to the first power line PL1. The gate GT may be connected to the dummy gate DGT.

The gate GT may serve as a first electrode of each of the first and second capacitors C1 and C2. Each of the first and second capacitors C1 and C2 may include a second electrode facing the first electrode, and the second electrode will be shown in a layout and a cross-section of the transistor E-TR below. The second electrode of the first capacitor C1 may be connected to the data line DL, and the second electrode of the second capacitor C2 may be connected to the first power line PL1.

The static electricity may be applied to the data line DL, however, the static electricity may be charged to the first and second capacitors C1 and C2 to be discharged, and thus, the static electricity may not be applied to the pixels PX. Accordingly, the static electricity may be prevented from being applied to the pixels PX by the anti-static circuit ASC.

FIGS. 7 to 14 are plan views of a structure of anti-static elements shown in FIG. 6.

In FIGS. 7 to 14, a sequential stack structure of the transistors E-TR, the first and second capacitors C1 and C2, the first and second power lines PL1 and PL2, and the data line DL will be shown.

Figure 7:
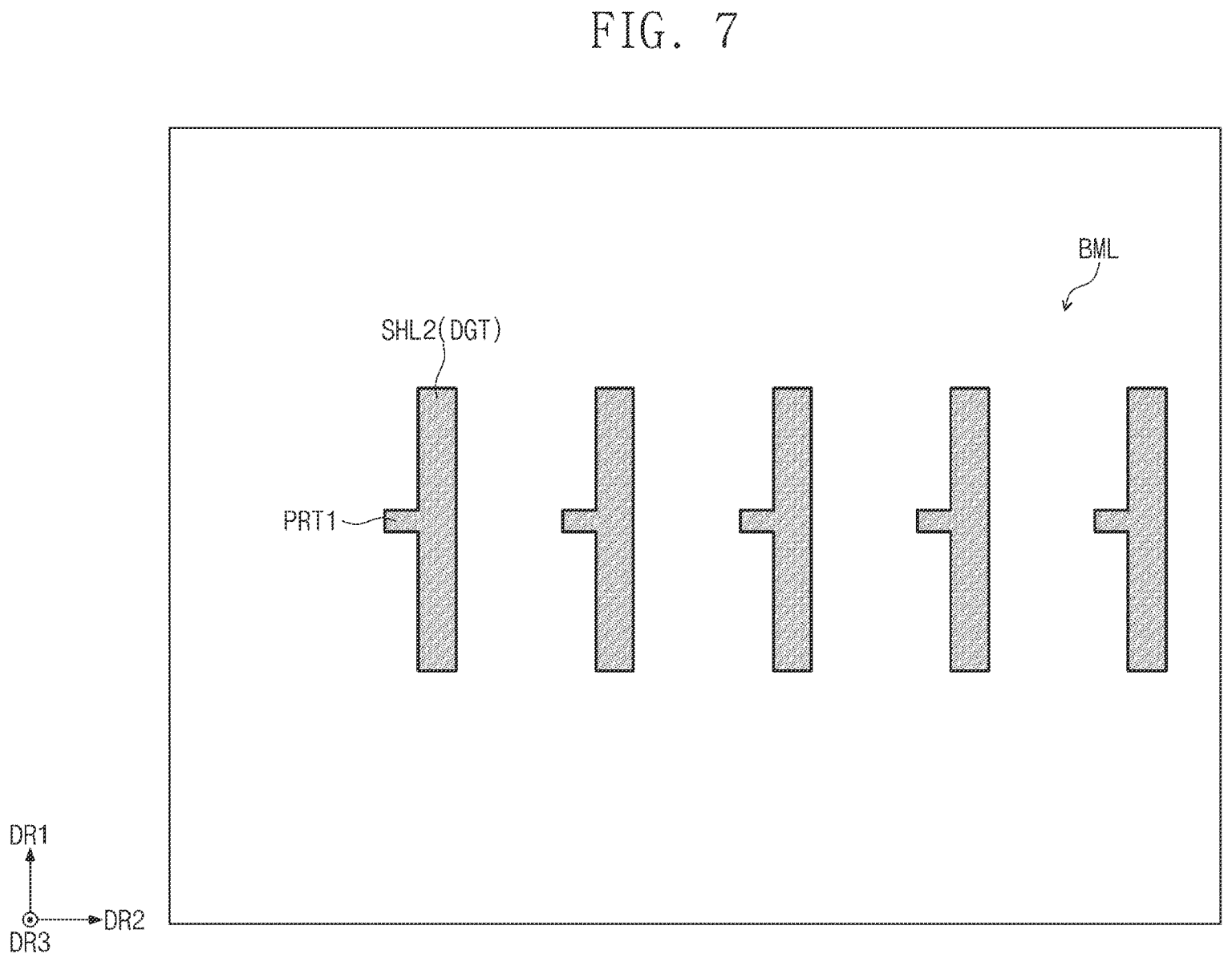

Referring to FIG. 7, the lower metal layer BML may be disposed on the substrate SUB shown in FIG. 5. The lower metal layer BML may include a plurality of second light shielding layers SHL2. The second light shielding layers SHL2 may include a conductive material.

Each of the second light shielding layers SHL2 may be formed as the dummy gate DGT described with reference to FIG. 6. The second light shielding layers SHL2 may extend in the first direction DR1 and may be arranged in the second direction DR2. A portion of each of the second light shielding layers SHL2 may protrude to a direction opposite to the second direction DR2 as a first protruding portion PRT1.

Figure 8:
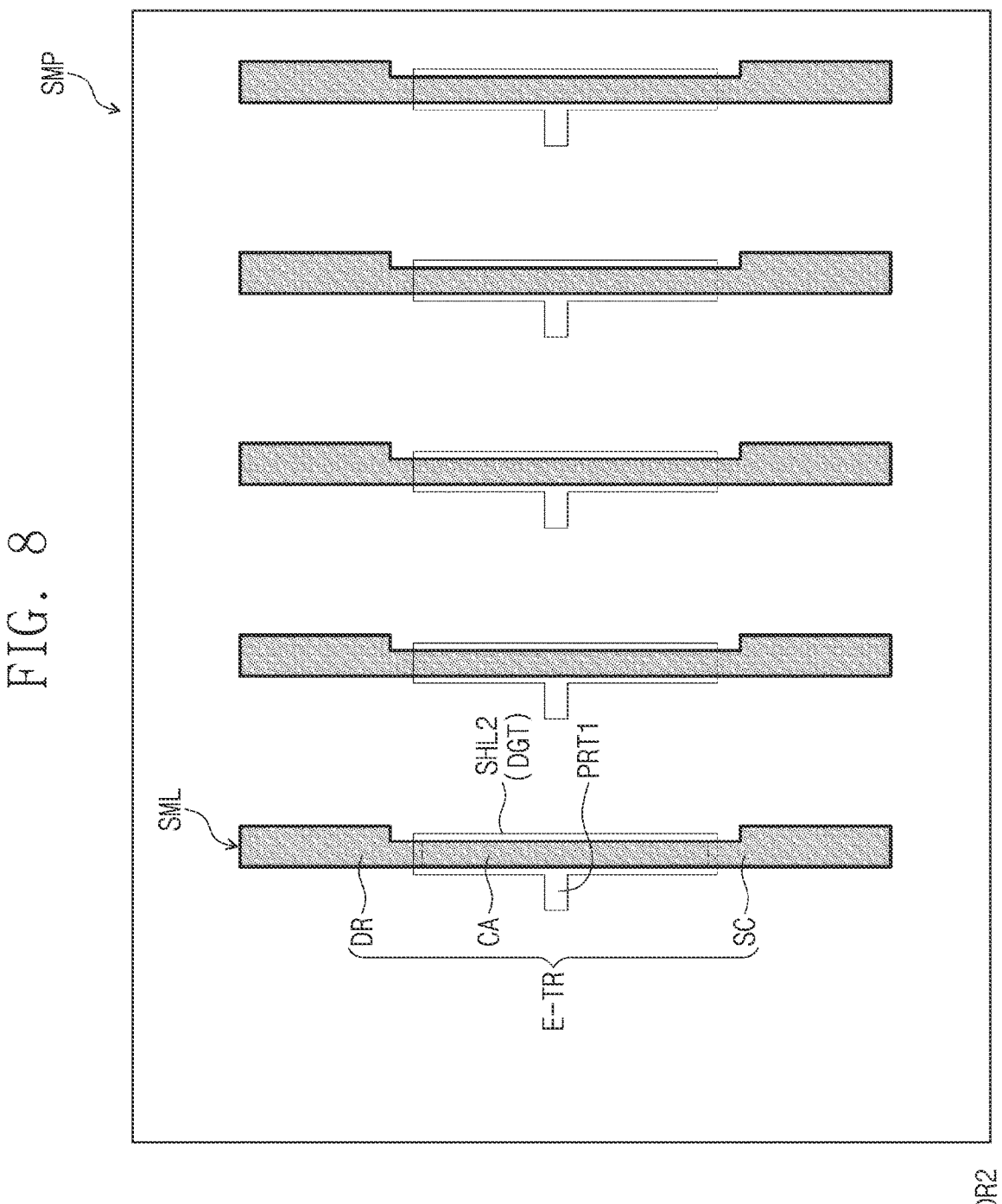

Referring to FIG. 8, a semiconductor pattern SMP may be disposed on the lower metal layer BML. The semiconductor pattern SMP may include a plurality of semiconductor layers SML. The semiconductor layers SML may extend in the first direction DR1 and may be arranged in the second direction DR2. When viewed in a plane, the second light shielding layers SHL2 may be disposed to respectively overlap the semiconductor layers SML.

The semiconductor layers SML may include an oxide semiconductor containing metal oxide semiconductor. Each of the semiconductor layers SML may include a plurality of areas distinguished from each other depending on whether the metal oxide is reduced or not. An area where the metal oxide is reduced (hereinafter, referred to as a reduced area) may have a conductivity higher than that of an area where the metal oxide is not reduced (hereinafter, referred to as a non-reduced area). The reduced area may correspond to the source area SC and the drain area DR. The non-reduced area may substantially correspond to a channel area CA.

The drain area DR, the source area SC, and the channel area CA of the transistor E-TR may be formed by each of the semiconductor layers SML. The drain area DR, the source area SC, and the channel area CA may be arranged in the first direction DR1. The channel area CA may be disposed between the drain area DR and the source area SC. The second light shielding layers SHL2 may be disposed to completely overlap the channel areas CA when viewed in the plane.

Hereinafter, a current pattern is illustrated as a shaded area with a thick line, and a previous pattern is illustrated with a thin line to show the current pattern more clearly.

Figure 9:
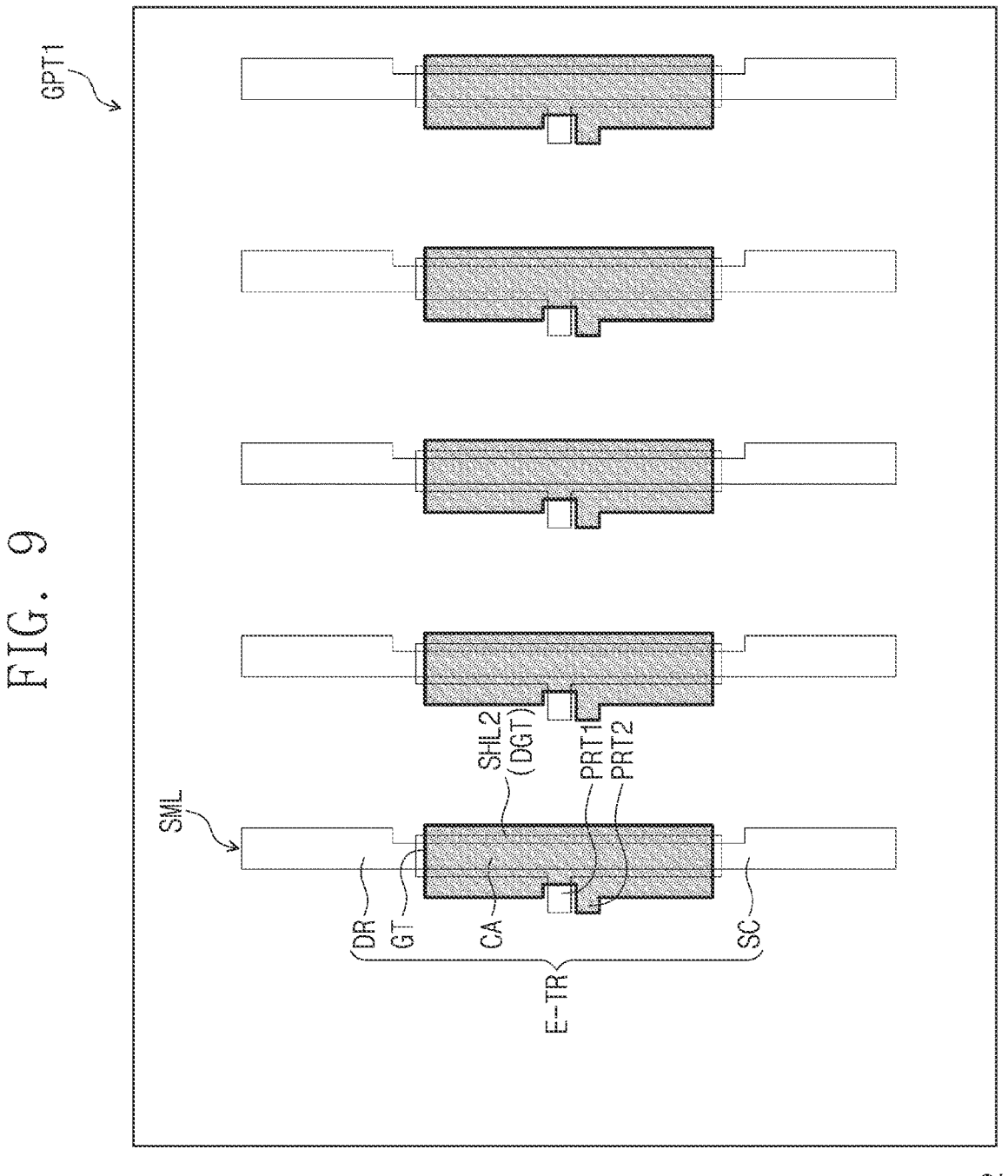

Referring to FIG. 9, a first gate pattern GPT1 may be disposed on the semiconductor pattern SMP. The first gate pattern GPT1 may include a plurality of gates GT. The gates GT may extend in the first direction DR1 and may be arranged in the second direction DR2. Each of the gates GT may act as the gate GT of the transistor E-TR. A portion of each of the gates GT may protrude to a direction opposite to the second direction DR2 and may act as a second protruding portion PRT2.

When viewed in the plane, the gates GT may be disposed to completely overlap the channel areas CA. Portions of the first gate pattern GPT1 overlapping the semiconductor layers SML may be defined as the gates GT. In addition, portions of the semiconductor layers SML overlapping the gates GT may be defined as the channel areas CA.

Figure 10:
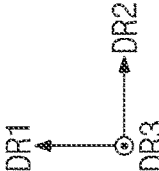

Referring to FIG. 10, a second gate pattern GPT2 may be disposed on the first gate pattern GPT1. The second gate pattern GPT2 may include a plurality of first metals ME1 and a plurality of second metal ME2. The first metals ME1 may be arranged in the second direction DR2. The second metals ME2 may be arranged in the second direction DR2. The first metals ME1 and the second metals ME2 may be spaced apart from each other in the first direction DR1.

When viewed in the plane, the first metals ME1 may partially overlap one end of the gates GT. The first metals ME1 may be disposed adjacent to the source areas SC. When viewed in the plane, the second metals ME2 may partially overlap the other end of the gates GT which opposing the one end. The second metals ME2 may be disposed adjacent to the drain areas DR.

The first capacitors C1 may be formed by the gates GT and the first metals ME1 overlapping the gates GT. The gates GT may act as the first electrodes of the first capacitors C1 and the first metals ME1 may act as the second electrodes of the first capacitors C1.

The second capacitors C2 may be formed by the gates GT and the second metals ME2 overlapping the gates GT. The gates GT may act as the first electrodes of the second capacitors C2 and the second metals ME2 may act as the second electrodes of the second capacitors C2.

Figure 11:
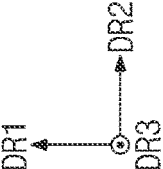

Referring to FIG. 11, a plurality of first-first contact holes CH1-1 may be defined to expose the source areas SC. A plurality of first-second contact holes CH1-2 may be defined to expose the first metals ME1 adjacent to the source areas SC.

A plurality of first-third contact holes CH1-3 may be defined to exposed the drain areas DR. A plurality of first-fourth contact holes CH1-4 may be defined to expose the second metals ME2 adjacent to the drain areas DR. First-fifth contact holes CH1-5 may be defined to expose the first protruding portions PRT1, and first-sixth contact holes CH1-6 may be defined to expose the second protruding portions PRT2.

When viewed in the plane, the first-fifth contact holes CH1-5 may overlap the first protruding portions PRT1 of the lower metal layer BM. When viewed in the plane, the first-sixth contact holes CH1-6 may overlap the second protruding portions PRT2 of the first gate pattern GPT1. Structures in cross-section of the first-first to first-sixth contact holes CH1-1 to CH1-6 will be described in detail later with reference to a cross-sectional view of the transistor E-TR.

Figure 12:
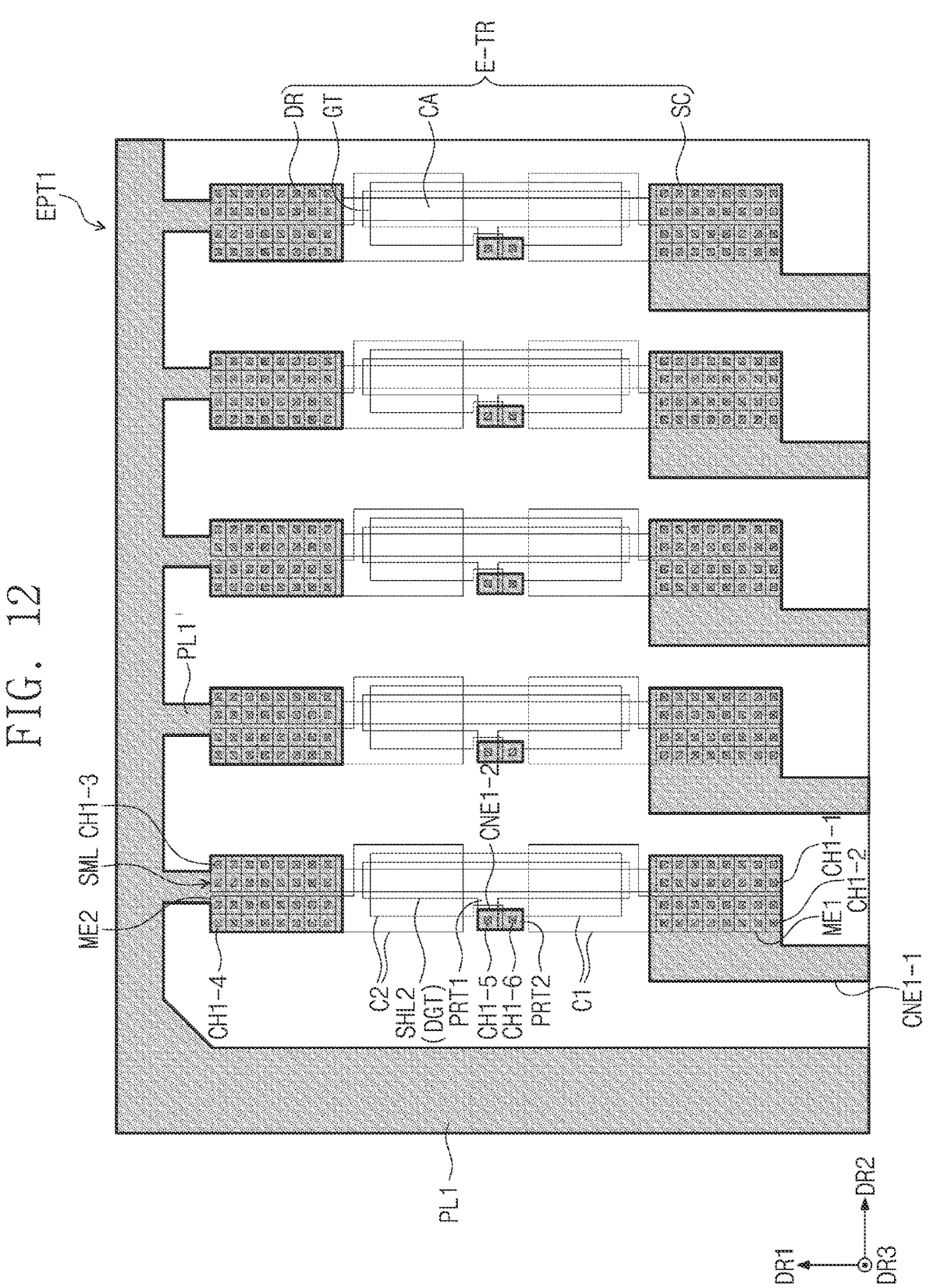

Referring to FIG. 12, a first electrode pattern EPT1 may be disposed on the second gate pattern GPT2. The first electrode pattern EPT1 may include the first power line PL1, a plurality of first-first connection electrodes CNE1-1, and a plurality of first-second connection electrodes CNE1-2.

The first power line PL1 may extend from a left side of the transistor E-TR disposed at the leftmost position to the first direction DR1, and when viewed in the plane, the first power line PL1 may extend from the above of the transistors E-TR to the second direction DR2.

The first power line PL1 may include a plurality of first power lines PL1' extending from portions of the first power line PL1, which extend in the second direction DR2, to the first direction DR1 toward the transistors E-TR. The first power lines PL1' may be arranged in the second direction DR2.

The first-first connection electrodes CNE1-1 may extend in the first direction DR1 and then may extend in the second direction DR2, and thus, the first-first connection electrodes CNE1-1 may be disposed on the source areas SC and portions of the first metals ME1 adjacent to the source areas SC. When viewed in the plane, the first-first connection electrodes CNE1-1 extending in the second direction DR2 may overlap the source areas SC and the portions of the first metals ME1 adjacent to the source areas SC.

The first-first connection electrodes CNE1-1 may be connected to the source areas SC via the first-first contact holes CH1-1. The first-first connection electrodes CNE1-1 may be connected to the first metals ME1 via the first-second contact holes CH1-2.

The first power lines PL1' may be disposed on the drain areas DR and portions of the second metals ME2 adjacent to the drain areas DR. When viewed in the plane, the first power lines PL1' may overlap the drain areas DR and the portions of the second metals ME2 adjacent to the drain areas DR.

The first power lines PL1' may be connected to the drain areas DR via the first-third contact holes CH1-3. The first power lines PL1' may be connected to the second metals ME2 via the first-fourth contact holes CH1-4.

The first-second connection electrodes CNE1-2 may be disposed on the first protruding portions PRT1 of the second light shielding layers SHL2 and the second protruding portions PRT2 of the gates GT. When viewed in the plane, the first-second connection electrodes CNE1-2 may overlap the first and second protruding portions PRT1 and PRT2.

The first-second connection electrodes CNE1-2 may be connected to the first and second protruding portions PRT1 and PRT2 via the first-fifth contact holes CH1-5 and the first-sixth contact holes CH1-6. Accordingly, the second light shielding layers SHL2 may be connected to the gates GT by the first-second connection electrodes CNE1-2. The second light shielding layers SHL2 may act as the dummy gates DGT.

Figure 13:
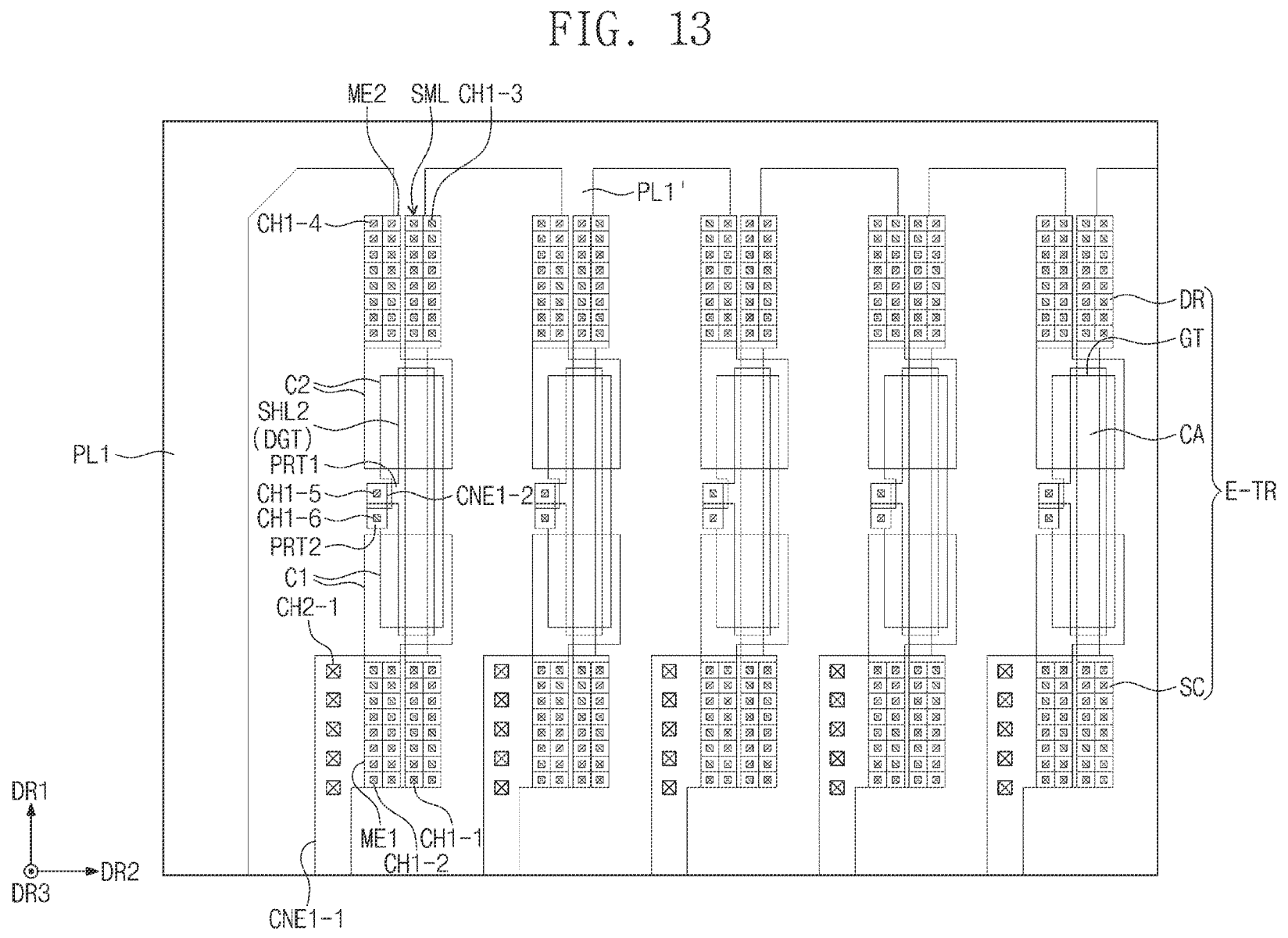

Referring to FIG. 13, a plurality of second-first contact holes CH2-1 may be defined above portions of the first-first connection electrodes CNE1-1, which do not overlap the source areas SC and the first metals MEL Structures in cross-section of the second-first contact holes CH2-1 will be described in detail later with reference to the cross-sectional view of the transistor E-TR.

Figure 14:
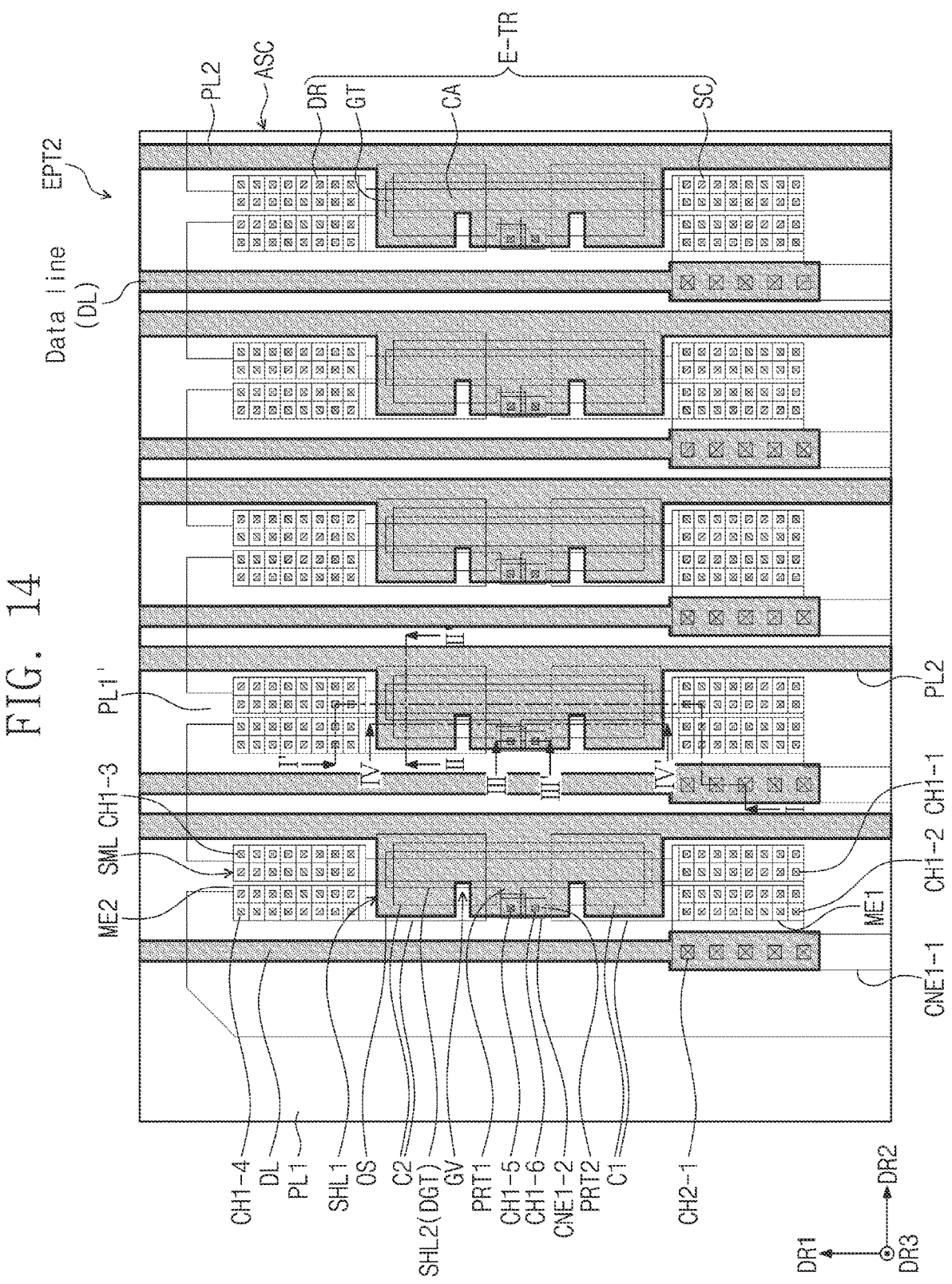

Referring to FIG. 14, a second electrode pattern EPT2 may be disposed on the first electrode pattern EPT1. The second electrode pattern EPT2 may include the second power lines PL2, the data lines DL, and the first light shielding layers SHL1.

The second power lines PL2 may extend in the first direction DR1 and may be arranged in the second direction DR2. The second power lines PL2 may be disposed adjacent to the transistors E-TR, respectively. The second power lines PL2 may be insulated from the first power line PL1 extending in the second direction DR2 while crossing the first power line PL1.

The data lines DL may extend in the first direction DR1 and may be arranged in the second direction DR2. The data lines DL may be connected to the first-first connection electrodes CNE1-1 via the second-first contact holes CH2-1. Accordingly, the data lines DL may be connected to the source areas SC and the first metals ME1 via the first-first connection electrodes CNE1-1.

Each of the transistors E-TR may be disposed between one data line DL and one second power line PL2 adjacent to each other. As an example, an h-th transistor E-TR may be disposed between an h-th data line DL and an h-th second power line PL2. In the present embodiment, h is a natural number.

Each of the first power lines PL1' may be disposed between a data line DL and a second power line PL2. As an example, an h-th first power line PL1' may be disposed between the h-th data line DL and the h-th second power line PL2.

The first light shielding layers SHL1 may extend from portions of the second power lines PL2 to the transistors E-TR and may be disposed on the transistors E-TR. An h-th first light shielding layer SHL1 may extend from a portion of the h-th second power line PL2 to the h-th data line DL.

The first light shielding layers SHL1 may include one sides OS facing the data lines DL. At least one groove GV may be defined in each of the one sides OS of the first light shielding layers SHL1. As an example, two grooves GV are defined in each of the one sides of the first light shielding layers SHL1, however, the number of the grooves GV should not be limited thereto or thereby.

When viewed in the plane, the first light shielding layers SHL1 may completely overlap the channel areas CA. In addition, the first light shielding layers SHL1 may overlap portions of the gates GT and portions of the first and second metals ME1 and ME2 when viewed in the plane.

When viewed in the plane, the first light shielding layers SHL1 may not overlap the first power lines PL1' and the first-first connection electrodes CNE1-1. The first light shielding layers SHL1 may be disposed between the first-first and first-second contact holes CH1-1 and CH1-2 and the first-third and first-fourth contact holes CH1-3 and CH1-4 when viewed in the plane. The first light shielding layers SHL1 may overlap the first-second connection electrodes CNE1-2 when viewed in the plane.

According to the planar structure shown in FIGS. 7 to 14, the data lines DL may be arranged at regular intervals in the second direction DR2. In addition, the first power lines PL1' and the second power lines PL2 may be arranged at regular intervals in the second direction DR2. In this case, elements, such as the transistors E-TR and the first and second capacitors C1 and C2, may be regularly arranged, and thus, a layout of the elements may be easily designed.

Figure 15:
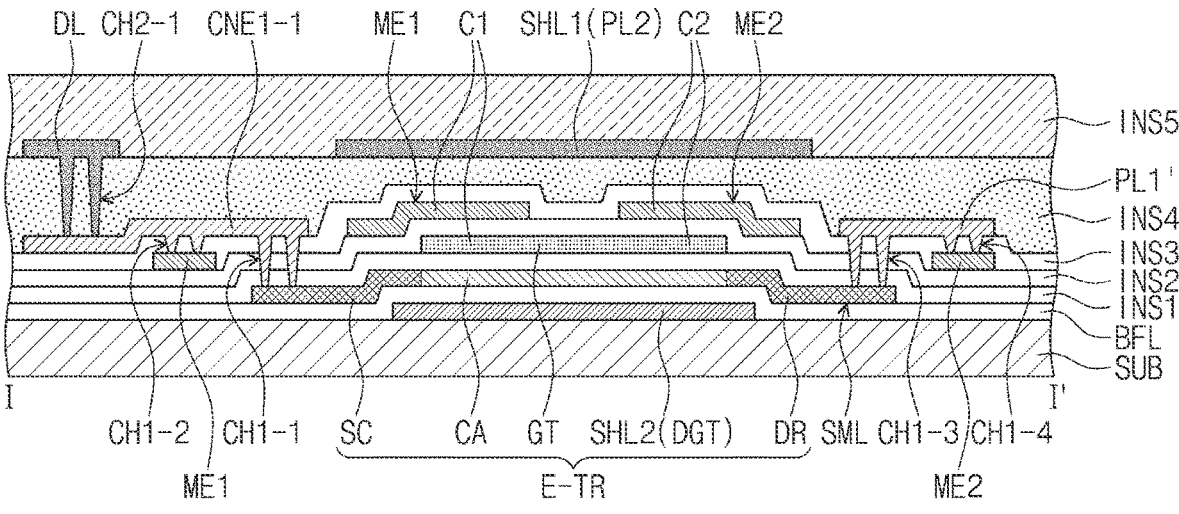
FIG. 15 is a cross-sectional view taken along a line I-I' shown in FIG. 14.

FIG. 15 is a cross-sectional view taken along a line I-I' shown in FIG. 14.

Referring to FIGS. 14 and 15, the second light shielding layer SHL2 may be disposed on the substrate SUB. The buffer layer BFL may be disposed on the substrate SUB to cover the second light shielding layer SHL2.

The semiconductor layer SML may be disposed on the buffer layer BFL. The semiconductor layer SML may include the source area SC, the drain area DR, and the channel area CA. The second light shielding layer SHL2 may be disposed under the semiconductor layer SML and may completely overlap the channel area CA when viewed in the plane.

The first insulating layer INS1 may be disposed on the buffer layer BFL to cover the semiconductor layer SML. The gate GT may be disposed on the first insulating layer INS1. The gate GT may completely overlap the channel area CA when viewed in the plane.

The second insulating layer INS2 may be disposed on the first insulating layer INS1 to cover the gate GT. The first metal ME1 and the second metal ME2 may be disposed on the second insulating layer INS2 and may be spaced apart from each other. As described above, the first capacitor C1 may be formed by the first metal ME1 and the gate GT overlapped with the first metal ME1, and the second capacitor C2 may be formed by the second metal ME2 and the gate GT overlapped with the second metal ME2.

The third insulating layer INS3 may be disposed on the second insulating layer INS2 to cover the first and second metals ME1 and ME2. The third insulating layer INS3 may be defined as an interlayer insulating layer that covers the transistor E-TR.

The first power line PL1 and the first-first connection electrode CNE1-1 may be disposed on the third insulating layer INS3. The first-first connection electrode CNE1-1 may be connected to the source area SC via the first-first contact holes CH1-1 defined through the first, second, and third insulating layers INS1, INS2, and INS3. The first-first connection electrode CNE1-1 may be connected to the first metal ME1 via the first-second contact holes CH1-2 defined through the third insulating layer INS3. Accordingly, the first-first connection electrode CNE1-1 may be connected to the source area SC and the first capacitor C1.

The first power line PL1 may be connected to the drain area DR via the first-third contact holes CH1-3 defined through the first, second, and third insulating layers INS1, INS2, and INS3. The first power line PL1 may be connected to the second metal ME2 via the first-fourth contact holes CH1-4 defined through the third insulating layer INS3. Accordingly, the first power line PL1 may be connected to the drain area DR and the second capacitor C2.

The fourth insulating layer INS4 may be disposed on the third insulating layer INS3 to cover the first power line PL1 and the first-first connection electrode CNE1-1. The fourth insulating layer INS4 may be defined as a planarization insulating layer that provides a flat upper surface.

The first light shielding layer SHL1 and the data line DL may be disposed on the fourth insulating layer INS4. The fifth insulating layer INS5 may be disposed on the fourth insulating layer INS4 to cover the first light shielding layer SHL1 and the data line DL. The first power line PL1 may be disposed on a layer different from a layer on which the first light shielding layer SHL1 and the data line DL are disposed, and the first light shielding layer SHL1 may be disposed on the same layer as the data line DL.

The first light shielding layer SHL1 may be disposed on the transistor E-TR and may be disposed to overlap the channel area CA when viewed in the plane. The data line DL may be connected to the first-first connection electrode CNE1-1 via the second-first contact holes CH2-1 defined through the fourth insulating layer INS4. The data line DL may be connected to the source area SC and the first capacitor C1 via the first-first connection electrode CNE1-1.

The first light shielding layer SHL1 and the second light shielding layer SHL2 may block a light from incident on the semiconductor layer SML of the transistor E-TR, e.g., the channel area CA. In a case where the light is provided to the semiconductor layer SML of the transistor E-TR, threshold voltage characteristics of the transistor E-TR may be changed by the light. That is, the threshold voltage may be shifted.

In FIG. 6, the transistor E-TR may be maintained in a turn-off state. However, in a case where the threshold voltage characteristics of the transistor E-TR is changed, the transistor E-TR may be malfunctioned, and thus, the transistor E-TR may be turned on. In this case, the data lines DL may be short-circuited with the first power lines PL1.

According to the present embodiment, the first and second light shielding layers SHL1 and SHL2 may block the lights from incident on the semiconductor layer SML of the transistor E-TR from above and from below the transistor E-TR. Accordingly, the threshold voltage characteristics of the transistor E-TR may not be changed.

The first and second metals ME1 and ME2, the first power line PL1, and the first-first connection electrode CNE1-1 may be disposed to overlap the semiconductor layer SML when viewed in the plane. Additionally, the first and second metals ME1 and ME2, the first power line PL1, and the first-first connection electrode CNE1-1 may block the light from traveling to the semiconductor layer SML.

Figure 16:
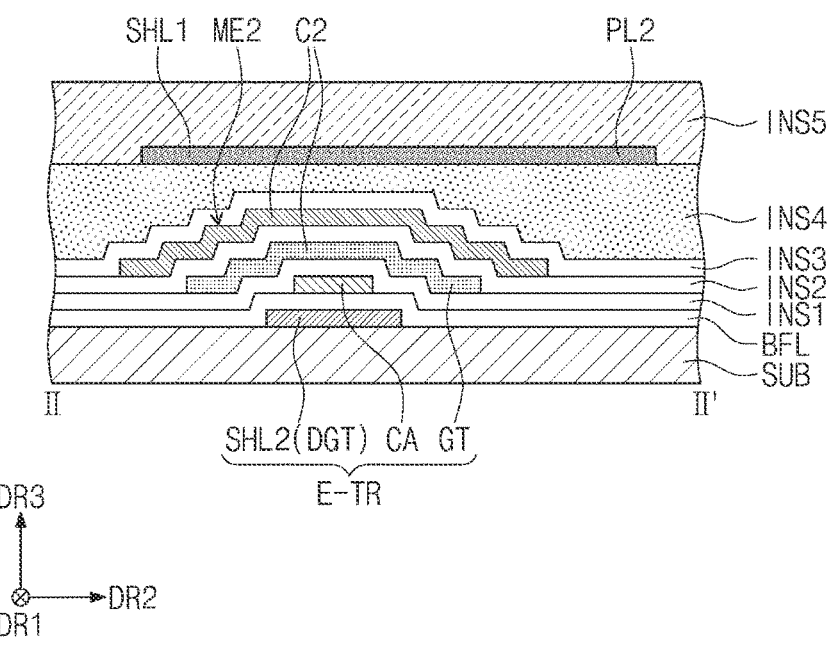
FIG. 16 is a cross-sectional view taken along a line II-II' shown in FIG. 14.
Figure 17:
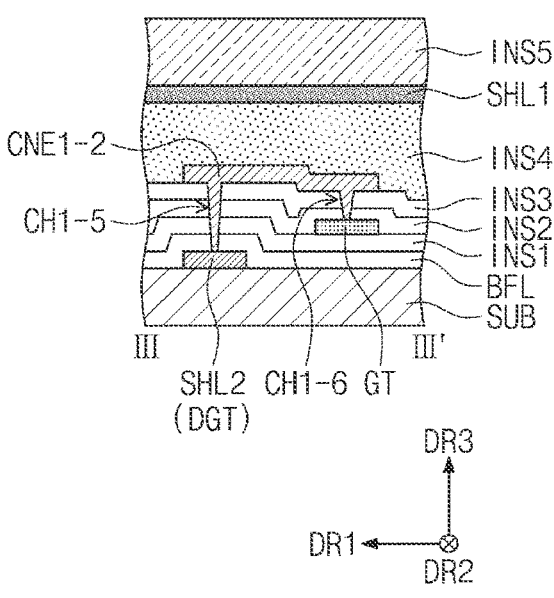
FIG. 17 is a cross-sectional view taken along a line III-III' shown in FIG. 14.
Figure 18:
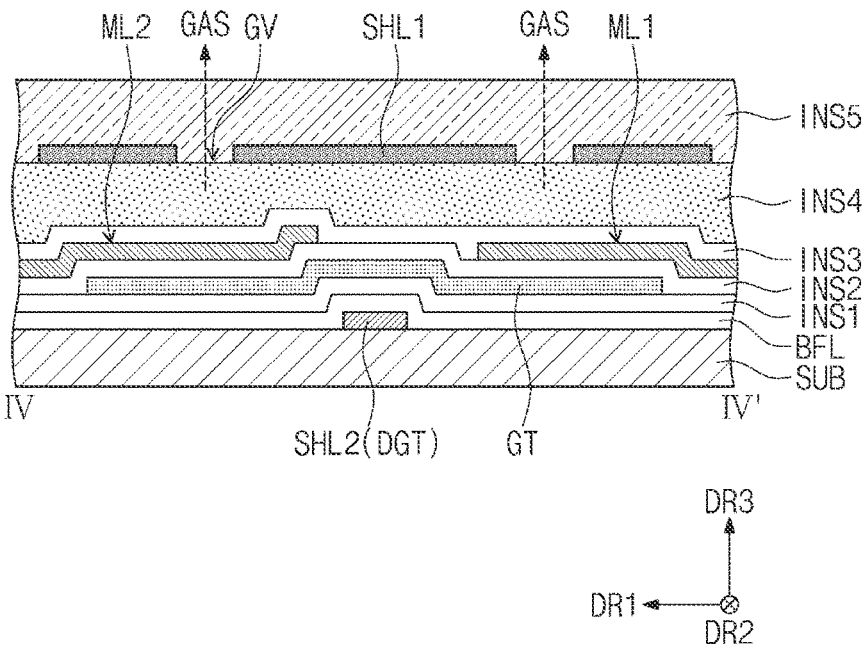
FIG. 18 is a cross-sectional view taken along a line IV-IV' shown in FIG. 14.

FIG. 16 is a cross-sectional view taken along a line II-II' shown in FIG. 14. FIG. 17 is a cross-sectional view taken along a line III-III' shown in FIG. 14. FIG. 18 is a cross-sectional view taken along a line IV-IV' shown in FIG. 14.

In FIGS. 16 to 18, the same reference numerals denote the same elements in FIG. 15, and thus, detailed descriptions of the same elements will be omitted.

Referring to FIGS. 14, 15, and 16, the channel area CA may be defined on the second light shielding layer SHL2, the gate GT may be disposed above the channel area CA, and the second metal ME2 may be disposed on the gate GT. The second power line PL2 may be disposed on the second metal ME2.

The second power line PL2 may be disposed on the fourth insulating layer INS4. The fifth insulating layer INS5 may be disposed on the fourth insulating layer INS4 to cover the second power line PL2. The first light shielding layer SHL1 may extend from the second power line PL2 and may be disposed on the transistor E-TR. The first power line PL1 may be disposed on a layer different from a layer on which the second power line PL2 and the data line DL are disposed, and the second power line PL2 may be disposed on the same layer as the data line DL.

Referring to FIGS. 14 and 17, the first-second connection electrode CNE1-2 may be disposed on the third insulating layer INS3, and the fourth insulating layer INS4 may be disposed on the third insulating layer INS3 to cover the first-second connection electrode CNE1-2.

The first-second connection electrode CNE1-2 may be connected to the second light shielding layer SHL2 via the first-fifth contact hole CH1-5 defined through the buffer layer BFL and the first to third insulating layers INS1 to INS3. The second light shielding layer SHL2 may include the first protruding portion PRT1 of the lower metal layer BML. The buffer layer BFL and the first to third insulating layers INS1 to INS3 may be disposed between the first-second connection electrode CNE1-2 and the second light shielding layer SHL2.

The first-second connection electrode CNE1-2 may be connected to the gate GT via the first-sixth contact hole CH1-6 defined through the second and third insulating layers INS2 and INS3. The gate GT may include the second protruding portion PRT2 of the first gate pattern GPT1. The second and third insulating layers INS2 and INS3 may be disposed between the first-second connection electrode CNE1-2 and the gate GT. The gate GT may be connected to the dummy gate DGT which is formed of the second light shielding layer SHL2 by the first-second connection electrode CNE1-2.

Referring to FIG. 18, the grooves GV may be defined in the first light shielding layer SHL1 disposed on the fourth insulating layer INS4. A gas GAS may be generated from the fourth insulating layer INS4 that is the organic layer. When the grooves GV are defined in the first light shielding layer SHL1, the gas GAS generated from the fourth insulating layer INS4 may be easily discharged upward via the grooves GV.

Figure 19:
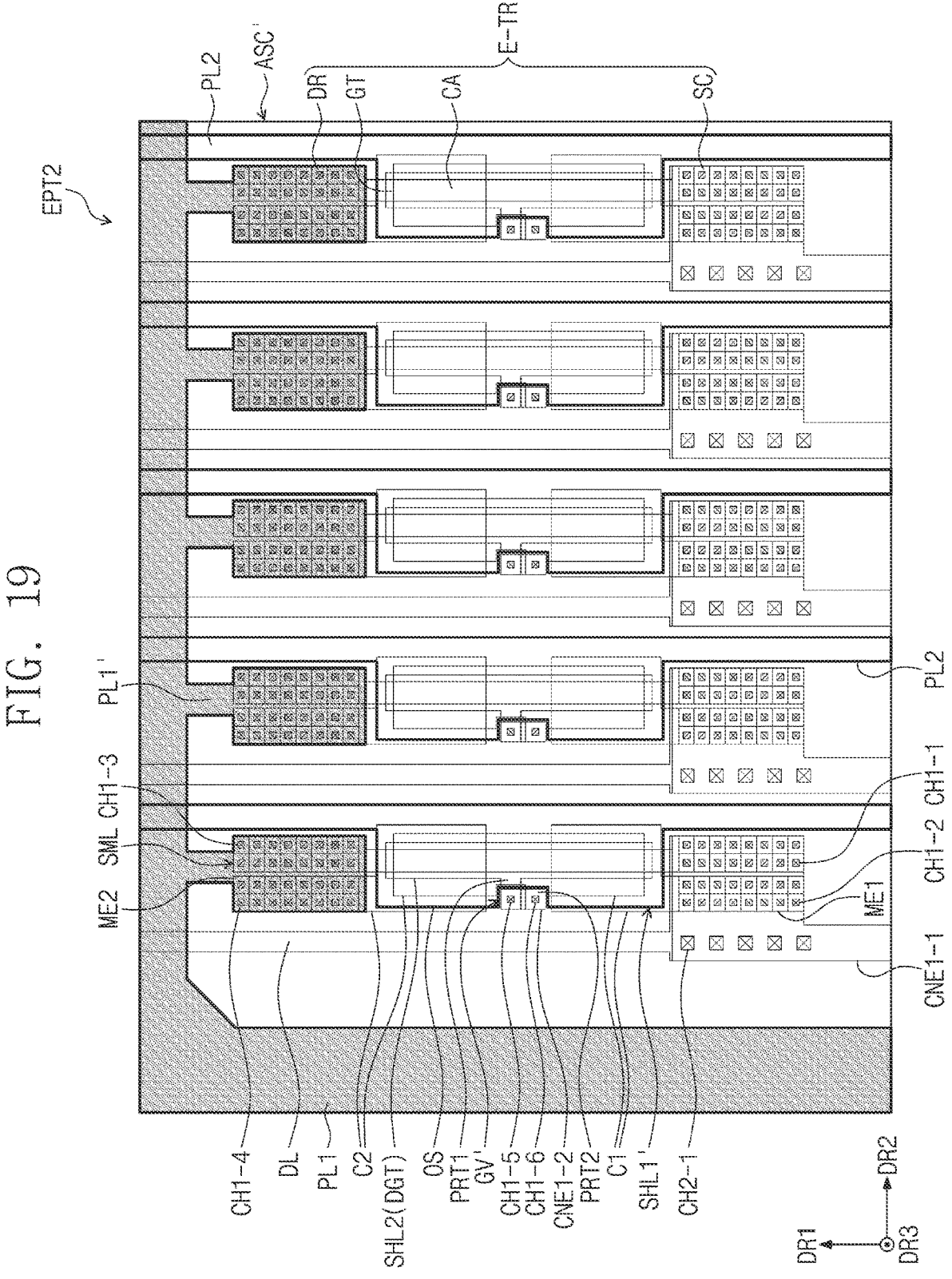
FIG. 19 is a plan view of a structure of an anti-static circuit according to an embodiment of the present disclosure.
Figure 20:
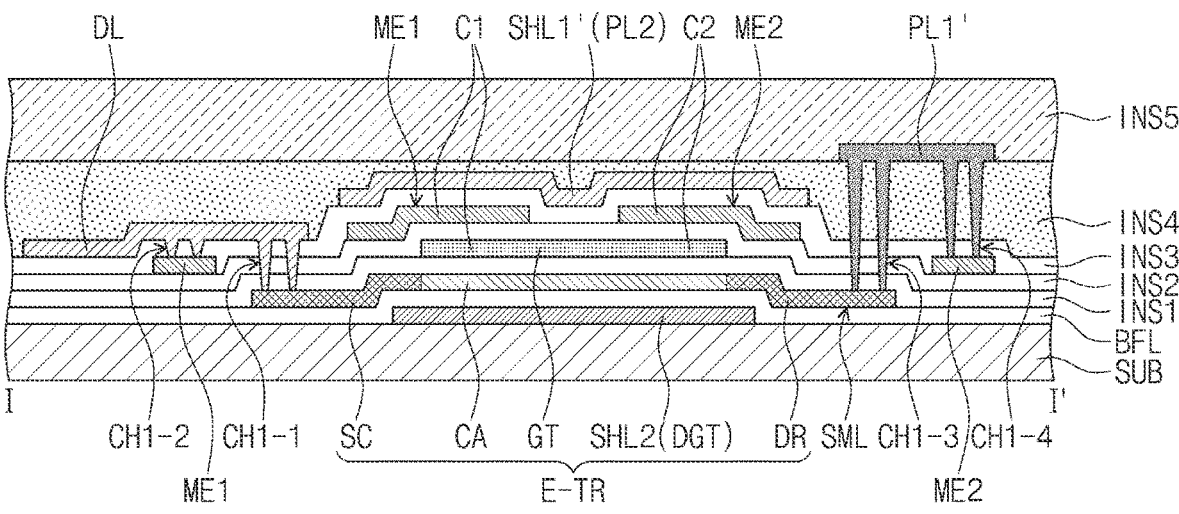
FIGS. 20 and 21 are cross-sectional views of an anti-static element shown in FIG. 19.
Figure 21:
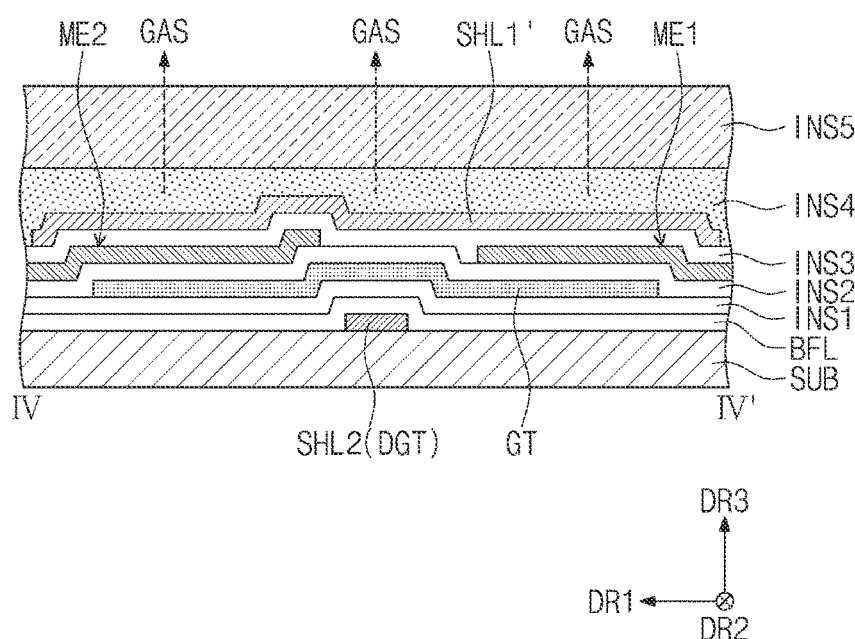

FIG. 19 is a plan view of a structure of an anti-static circuit ASC' according to an embodiment of the present disclosure. FIGS. 20 and 21 are cross-sectional views of the anti-static element shown in FIG. 19.

As an example, FIG. 19 is a plan view corresponding to the plan view of FIG. 14, and FIGS. 20 and 21 are cross-sectional views respectively corresponding to the cross-sectional views of FIGS. 15 and 18. Hereinafter, in FIG. 19, descriptions will be focused on features of the anti-static circuit ASC' different from those of the anti-static circuit ASC shown in FIG. 14.

Referring to FIG. 19, a second electrode pattern EPT2 may include a first power line PL1. Data lines DL, second power lines PL2, and first light shielding layers SHL1 may be disposed at a position lower than the first power line PL1. This cross-sectional structure will be described in detail with reference to FIGS. 20 and 21. As an example, the second power lines PL2 are indicated by a bold line in FIG. 19.

Substantially, the data lines DL shown in FIG. 19 may be disposed on the same layer as the first-first connection electrodes CNE1-1 shown in FIG. 14 and may be provided integrally with the first-first connection electrodes CNE1-1, respectively.

Grooves GV may not be defined in one sides OS of the first light shielding layers SHL1. However, grooves GV' overlapping first-second connection electrodes CNE1-2 may be defined in the first light shielding layers SHL1. Accordingly, the first light shielding layers SHL1 may be disposed not to overlap the first-second connection electrodes CNE1-2 when viewed in the plane.

Referring to FIGS. 20 and 21, the data line DL may be disposed on a third insulating layer INS3. A first light shielding layer SHL1' and the second power line PL2 may be disposed on the third insulating layer INS3. A fourth insulating layer INS4 may be disposed on the third insulating layer INS3 to cover the data line DL, the first light shielding layer SHL1', and the second power line PL2. The first power line PL1 may be disposed on the fourth insulating layer INS4.

The data line DL may be connected to a source area SC via first-first contact holes CH1-1 defined through the first, second, and third insulating layers INS1, INS2, and INS3 and may be connected to a first metal ME1 through first-second contact holes CH1-2 defined through the third insulating layer INS3.

The first power line PL1 may be connected to a drain area DR via first-third contact holes CH1-3 defined through the first to fourth insulating layers INS1 to INS4 and may be connected to a second metal ME2 via first-fourth contact holes CH1-4 defined through the third and fourth insulating layers INS3 and INS4.

The first light shielding layer SHL1' may be disposed on the third insulating layer INS3 and may block a light from traveling to the semiconductor layer SML. Since the first light shielding layer SHL1' is not disposed on the fourth insulating layer INS4, grooves GV (refer to FIG. 18) through which the gas GAS generated from the fourth insulating layer INS4 is discharged may not be defined in the first light shielding layer SHL1'.

Figure 22:
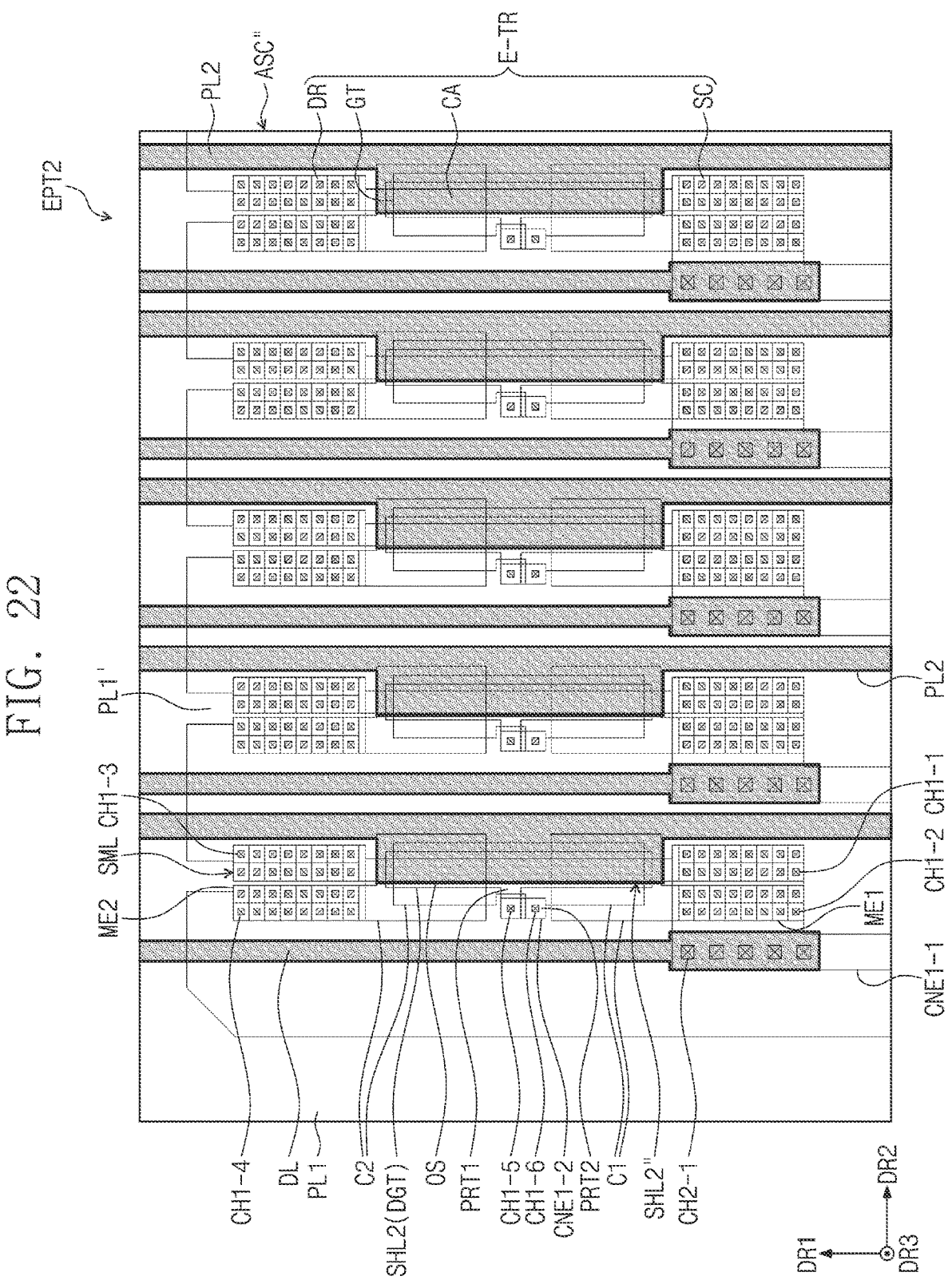
FIG. 22 is a plan view of a structure of an anti-static circuit according to an embodiment of the present disclosure.

FIG. 22 is a plan view of a structure of an anti-static circuit ASC" according to an embodiment of the present disclosure.

As an example, FIG. 22 is a plan view corresponding to the plan view of FIG. 14, Hereinafter, in FIG. 22, descriptions will be focused on features of the anti-static circuit ASC" different from those of the anti-static circuit ASC shown in FIG. 14.

Referring to FIG. 22, first light shielding layers SHL1" of the anti-static circuit ASC" may not overlap a first-second connection electrode CNE1-2, and grooves GV and GV' may not be defined. The first light shielding layers SHL1" may be disposed to overlap at least a channel area CA to block a light from being incident on the channel area CA of a semiconductor layer SML.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. A display device comprising:
a data line;
a first power line providing a first voltage;
a second power line providing a second voltage having a lower level than the first voltage;
a pixel disposed in a display area, and connected to the data line, the first power line and the second power line;
a transistor disposed in a non-display area around the display area and connected to the data line and the first power line; and
a first light shielding layer extending from a portion of the second power line to the transistor and disposed on the transistor,
wherein the first power line is disposed between the data line and the second power line in the non-display area along a first direction, and the first power line connected to the transistor is electrically separated from the second power line in the non-display area, and
wherein the first light shielding layer does not overlap the first power line, which is directly connected to the transistor in the non-display area, when viewed on a plane.

2. The display device of claim 1, wherein the transistor is disposed between the data line and the second power line.

3. The display device of claim 1, wherein the first light shielding layer includes at least one groove defined in one side of the first light shielding layer.

4. The display device of claim 3, wherein the one side of the first light shielding layer faces the data line.

5. The display device of claim 1, wherein the first power line is disposed on a layer different from a layer on which the second power line and the data line are disposed.

6. The display device of claim 1, further comprising:

an interlayer insulating layer covering the transistor; and a planarization insulating layer disposed on the interlayer insulating layer, wherein the first power line is disposed on the interlayer insulating layer, the planarization insulating layer covers the first power line, and the second power line and the data line are disposed on the planarization insulating layer.

7. The display device of claim 1, wherein the transistor comprises:

a semiconductor layer comprising a source area connected to the data line, a drain area connected to the first power line, and a channel area disposed between the source area and the drain area; and a gate disposed on the semiconductor layer and overlapping the channel area when viewed on the plane.

8. The display device of claim 7, wherein the first light shielding layer overlaps the channel area when viewed on the plane.

9. The display device of claim 7, further comprising:

a first metal disposed on the gate and connected to the data line; and a second metal disposed on the gate and connected to the first power line.

10. The display device of claim 9, wherein the first light shielding layer overlaps a portion of the gate and portions of the first metal and the second metal when viewed on the plane.

11. The display device of claim 7, further comprising a second light shielding layer disposed under the semiconductor layer and overlapping the channel area.

12. The display device of claim 11, wherein the second light shielding layer is connected to the gate.

13. The display device of claim 12, further comprising:

a connection electrode disposed on the gate and the second light shielding layer; and an insulating layer disposed between the gate and the connection electrode and between the second light shielding layer and the connection electrode, wherein the connection electrode is connected to the gate and the second light shielding layer via contact holes defined through the insulating layer.

14. The display device of claim 13, wherein the first light shielding layer overlaps the connection electrode when viewed on the plane.

15. The display device of claim 13, wherein the first light shielding layer does not overlap the connection electrode when viewed on the plane.

16. The display device of claim 1, further comprising:

an interlayer insulating layer covering the transistor; and a planarization insulating layer disposed on the interlayer insulating layer, wherein the second power line and the data line are disposed on the interlayer insulating layer, the planarization insulating layer covers the second power line and the data line, and the first power line is disposed on the planarization insulating layer.

17. An electronic device comprising:

a data line;

a first power line providing a first voltage;

a second power line providing a second voltage having a lower level than the first voltage;

a pixel disposed in a display area, and connected to the data line, the first power line and the second power line;

a transistor disposed in a non-display area around the display area and connected to the data line and the first power line; and a first light shielding layer extending from a portion of the second power line to the transistor and disposed on the transistor, wherein the first light shielding layer is provided with a plurality of grooves defined in one side of the first light shielding layer, and each of the plurality of grooves of the first light shielding layer is separated from a semiconductor layer of the transistor in the non-display area when viewed on a plane, wherein the first power line is disposed between the data line and the second power line in the non-display area along a first direction, and wherein the first power line connected to the transistor is electrically separated from the second power line in the non-display area.

18. The electronic device of claim 17, further comprising:

an interlayer insulating layer covering the transistor; and a planarization insulating layer disposed on the interlayer insulating layer and including an organic layer, wherein the first light shielding layer is disposed on the planarization insulating layer.

19. The electronic device of claim 18, wherein gases generated from the planarization insulating layer are discharged through the plurality of grooves.

\* \* \* \* \*